(12) United States Patent
Ikeda et al.

(10) Patent No.: US 7,848,176 B2
(45) Date of Patent: Dec. 7, 2010

(54) SEMICONDUCTOR MEMORY DEVICE

(75) Inventors: Hitoshi Ikeda, Kawasaki (JP); Shinya Fujioka, Kawasaki (JP); Takahiro Sawamura, Kawasaki (JP)

(73) Assignee: Fujitsu Semiconductor Limited, Yokohama (JP)

( * ) Notice: Subject to any disclaimer, the term of this patent is extended or adjusted under 35 U.S.C. 154(b) by 42 days.

(21) Appl. No.: 12/428,828

(22) Filed: Apr. 23, 2009

(65) Prior Publication Data

US 2009/0207682 A1 Aug. 20, 2009

Related U.S. Application Data

(60) Division of application No. 11/488,024, filed on Jul. 18, 2006, now Pat. No. 7,570,541, which is a division of application No. 11/114,087, filed on Apr. 26, 2005, now Pat. No. 7,102,960, which is a continuation of application No. PCT/JP03/08278, filed on Jun. 30, 2003.

(51) Int. Cl.
*G11C 8/00* (2006.01)
(52) U.S. Cl. .................................. 365/230.06; 365/239
(58) Field of Classification Search ............ 365/230.06, 365/239, 233.1, 230.08
See application file for complete search history.

(56) References Cited

U.S. PATENT DOCUMENTS

| 5,452,261 | A | 9/1995 | Chung et al. |
| 5,528,552 | A | 6/1996 | Kamisaki |
| 5,815,459 | A | 9/1998 | Park et al. |
| 5,848,020 | A * | 12/1998 | Mori ..................... 365/230.06 |
| 5,936,909 | A | 8/1999 | Sonoda et al. |
| 6,185,149 | B1 | 2/2001 | Fujioka et al. |
| 6,356,504 | B1 | 3/2002 | Kim |
| 6,426,915 | B2 | 7/2002 | Ohshima et al. |
| 6,556,504 | B2 * | 4/2003 | Kwon et al. ........... 365/230.08 |
| 6,992,948 | B2 | 1/2006 | Asada |
| 7,009,892 | B2 * | 3/2006 | Morikawa et al. ...... 365/185.25 |

FOREIGN PATENT DOCUMENTS

| JP | 62-1182 A | 1/1987 |
| JP | 63-53788 A | 3/1988 |
| JP | 64-14795 A | 1/1989 |
| JP | 2-193394 A | 7/1990 |
| JP | 3-252991 A | 11/1991 |
| JP | 4-78092 A | 3/1992 |
| JP | 4-82084 A | 3/1992 |

(Continued)

*Primary Examiner*—Anh Phung
(74) *Attorney, Agent, or Firm*—Arent Fox, LLP

(57) ABSTRACT

A word control circuit activates word lines corresponding to a start row address and a next row address overlappingly in the continuous mode. Accordingly, even in the case where the start address indicates an end memory cell connected to a word line, the switching operation of the word line becomes unnecessary. Memory cells connected to different word lines can be thus accessed in a sequential manner. That is, a controller accessing a semiconductor memory device can access the memory without data interruption. This can prevent the data transfer rate from lowering. Furthermore, it is made unnecessary to form a signal and a control circuit for informing a controller of the fact that a word line is being switched so that the construction of a semiconductor memory device and a control circuit of the controller can be simplified. This results in reduction of the system cost.

20 Claims, 18 Drawing Sheets

FOREIGN PATENT DOCUMENTS

| | | |
|---|---|---|
| JP | 5-182455 A | 7/1993 |
| JP | 6-111565 A | 4/1994 |
| JP | 9-106669 | 4/1997 |
| JP | 10-83674 A | 3/1998 |
| JP | 10-275477 A | 10/1998 |
| JP | 11-7765 A | 1/1999 |
| JP | 2000-82287 A | 3/2000 |
| JP | 2002-56685 A | 2/2002 |

* cited by examiner

| row address | | | | | | | memory blocks to be activated | reference numerals in Fig. 7 |
|---|---|---|---|---|---|---|---|---|
| A19 | A18 | A17 | ... | A10 | A09 | A08 | | |
| L | L | L | ... | L | L | L | M0,M1 | (a) |
| L | L | L | ... | L | L | H | M1,M0 | (c) |
| L | L | L | ... | L | H | L | M0,M1 | (a) |
| L | L | L | ... | L | H | H | M1,M0 | (c) |
| ... | ... | ... | ... | ... | ... | ... | ... | ... |
| L | H | H | ... | H | H | L | M0,M1 | (a) |
| L | H | H | ... | H | H | H | M1,M2 | (e) |
| H | L | L | ... | L | L | L | M2,M3 | (b) |
| H | L | L | ... | L | L | H | M3,M2 | (d) |
| H | L | L | ... | L | H | L | M2,M3 | (b) |
| H | L | L | ... | L | H | H | M3,M2 | (d) |
| ... | ... | ... | ... | ... | ... | ... | ... | ... |
| H | H | H | ... | H | H | L | M2,M3 | (b) |
| H | H | H | ... | H | H | H | M3,M0 | (f) |
| L | L | L | ... | L | L | L | M0,M1 | (a) |
| L | L | L | ... | L | L | H | M1,M0 | (c) |
| ... | ... | ... | ... | ... | ... | ... | ... | ... | forward direction of address →

| A19 | A18 | A09 | A08 | A03 | A02 | A01 | A00 | memory blocks to be activated | reference numerals in Fig. 14 |
|---|---|---|---|---|---|---|---|---|---|
| L | L | L | L | L | L | L | L | M0,M1 | |
| L | L | L | L | L | L | L | H | M0,M1 | |
| L | --- | --- | --- | --- | --- | --- | --- | --- | |
| L | L | H | H | H | H | L | H | M1,M0 | (a) |
| L | L | H | H | H | H | H | L | M0,M1 | |
| L | H | H | H | H | H | H | H | M1,M2 | (c) |
| H | L | L | L | L | L | L | L | M2,M3 | |
| H | L | --- | --- | --- | --- | --- | --- | M2,M3 | |
| H | L | L | L | L | L | L | H | M2,M3 | |
| H | L | H | H | H | H | L | H | M3,M2 | (b) |
| H | L | H | H | H | H | H | H | M2,M3 | |
| H | H | H | H | H | H | L | H | M3,M0 | (d) |
| L | L | L | L | L | L | H | L | M0,M1 | |
| L | L | --- | --- | --- | --- | --- | --- | M0,M1 | |

Fig. 15 forward direction of address →

SEMICONDUCTOR MEMORY DEVICE

CROSS REFERENCE TO RELATED APPLICATION

This application is a Divisional of U.S. patent application Ser. No. 11/488,024 filed Jul. 18, 2006 now U.S. Pat. No. 7,570,541, issued on Aug. 4, 2009, which is a Divsional of U.S. patent application Ser. No. 11/114,087 filed Apr. 26, 2005, now U.S. Pat. No. 7,102,960, which in turn is a Continuation of International Application PCT/JP03/08278 filed Jun. 30, 2003. The disclosures of the prior applications are hereby incorporated by reference herein in their entirety.

BACKGROUND OF THE INVENTION

1. Field of the Invention

The present invention relates to a semiconductor memory device having continuous mode in which read data is outputted in a continuous manner or write data is inputted in a continuous manner.

2. Description of the Related Art

In general, a clock synchronous type semiconductor memory device, such as SDRAM, has the burst mode or the continuous mode, in which read data is outputted in a continuous manner or write data is inputted in a continuous manner, in synchronization with a clock. A semiconductor memory device having this kind of the operation mode includes an address counter that generates an internal address following the start address, which is received via an external terminal. Further, the semiconductor memory device sequentially outputs or inputs data indicated by the internal address generated by the address counter.

The burst mode is the operation mode in which data is sequentially read from a plurality of memory cells connected to one word line, or data is written into these memory cells in a sequential manner (for example, disclosed in Japanese Unexamined Patent Application Publication No. Hei 9-106669). In the semiconductor memory device having the burst mode, the number of output data or the number of input data is set in advance as the burst length.

The continuous mode is the operation mode in which data is sequentially read from memory cells respectively connected to a plurality of word lines, or data is written into these memory cells in a sequential manner. In the continuous mode, the burst length is not decided. Data of the entire address can be inputted and outputted continuously by keeping chips to be operated.

FIG. 1 illustrates an example of the read operation and the write operation of the semiconductor memory device having the continuous mode.

The semiconductor memory device inputs or outputs data in synchronization with a rising edge of a clock signal CLK. This kind of the operation mode is generally called "SDR (Single Data Rate) mode".

In this example, 4-bit parallel data is simultaneously read from a memory array via a 1-bit data terminal DQ, and is latched in a data latch through a data bus line DB. The data latch converts the received parallel data into serial data, and sequentially outputs the data to the data terminal DQ in synchronization with a clock.

In the continuous read operation, a chip enable signal /CE is first activated, and an address signal AD (A05, in this example) that indicates the start address of read data is then provided to a semiconductor memory device (FIG. 1(a)). An internal circuit of the semiconductor memory device continuously activates a column selection signal CL twice in order to connect predetermined bit lines within the memory array to data bus lines DB (DB1, DB2), respectively (FIG. 1(b)). At this time, by activating the column selection signal CL, four read data D04-07 including data D05 corresponding to the address A05, and four read data D08-11 corresponding to addresses A08-11 following the address A05 are transferred to the data bus lines DB1, DB2, and then latched in the data latch (FIGS. 1(c) and 1(d)). That is, data for 8 addresses are latched in the data latch every data terminal DQ.

Thereafter, the latched parallel read data is converted into serial data, and are then sequentially outputted in synchronization with a clock signal CLK (FIG. 1(e)). After the read data D05-07 are all outputted, the column selection signal CL corresponding to next addresses A12-15 is activated, and read data D12-15 are thus latched in the data latch (FIG. 1(f)). The latched read data is converted into serial data, and are then outputted in a sequential manner in synchronization with the clock signal CLK.

On the one hand, in the continuous write operation, after a predetermined clock from the supply of the start address A05, the write data D05, D06, D07 and so on are sequentially provided to the data terminal DQ in synchronization with the clock signal CLK (FIG. 1(g)). Serial write data is converted into parallel data, and are then latched in the data latch. After a predetermined number of the write data is latched in the data latch, the column selection signal CL is activated, and the write data is thus written into memory cells through the data bus line DB (FIGS. 1(h) and 1(i)). In this case, a data bus line DB2 includes negative write data D04. However, the data D04 are not written into the memory cells due to inactivation of the column selection signal CL corresponding to the data D04 or inactivation of a write amplifier corresponding to the data D04.

FIG. 2 shows an example of the switch operation of the word line in the continuous read operation.

In the continuous mode, in order to continuously read data from the memory cells connected to a plurality of the word lines, the word line needs to be switched. In FIG. 2, 00 to n-1 affixed to the clock signal CLK refer to column addresses of output data. That is, in this example, the column address is n types.

A word line WLm is inactivated (FIG. 2(b)) after data Dn-4 to Dn-1 corresponding to the end 4-bit n-4 to n-1 (the end address) of the column address are latched in the data latch (FIG. 2(a)). A next word line WLm+1 is activated after a predetermined period from the inactivation of the word line WLm (FIG. 2(c)).

Such inactivation of the word line WLm and activation of the word line WLm+1 are performed at a timing that is generated within the tip so that it is not synchronized to the clock signal CLK. The column selection signal CL is activated on a 4-block basis. The inactivation of the word line WLm and the activation of the next word line WLm+1 are implemented between the four clock cycles. Meanwhile, whenever the column selection signal CL is activated, the read data is read on a 4-bit basis, and are outputted to the data terminal DQ without being interrupted.

FIG. 3 shows another example of the switch operation of the word line in the conventional continuous read operation.

In this example, the end address n-1 of the column address is provided as the start address (FIG. 3(a)). A word line WLm corresponding to the row address, which is supplied together with the column address, is first activated (FIG. 3(b)). A column selection signal CL corresponding to the end address n-1 is then activated (FIG. 3(c)). Read data Dn-4 to Dn-1 for 4 addresses, including the end address n-1, are read out to a data bus line DB1 from memory cells, and are then latched in the data latch (FIG. 3(d)).

Since the start address is the end address n-1 of the column address, data corresponding to next four column addresses have to be read after the word lines are switched. Accordingly, a second column selection signal CL cannot be activated subsequent to the first column selection signal CL, unlike FIG. 1.

The word line WLm is inactivated in synchronization with a falling edge of the first column selection signal CL (FIG. 3(e)), in the same manner as FIG. 2. A next word line WLm+1 is then activated (FIG. 3(f)).

The second column selection signal CL is activated after the word line WLm+1 is activated (FIG. 3(g)). Furthermore, data D00-D03 corresponding to column addresses 00-03 (word line WLm+1) are latched in the data latch through a data bus line DB2 (FIG. 3(h)). Four clocks are needed from the switch operation of the word lines WL until the data is outputted. For this reason, the first read data D00 corresponding to the word line WLm+1 are outputted by skipping 3 clocks starting from the clock signal that outputs the data Dn-1 (FIG. 3(i)).

As such, in the continuous read operation, in the case where an address adjacent to the end address of the column address is designated as the start address, an non-output period occurs from the time when data corresponding to the first word line WLm are outputted until the time when data corresponding to the next word line WLm+1 are outputted.

The semiconductor memory device has to output a wait signal /WAIT in order to transfer the non-output period of data to a controller that has access to itself (FIG. 3(j)). Accordingly, the controller must include a control circuit of the wait signal /WAIT. Control of the semiconductor memory device by the controller, however, adds complication. Furthermore, since terminals for the wait signal /WAIT are necessary in the semiconductor memory device and the controller, the chip size also increases.

FIG. 4 illustrates still another example of the switch operation of the word line in the conventional continuous read operation.

In this example, an address, which is located one earlier than the end column address n-1, is supplied as the start address (FIG. 4(a)). At this time, the semiconductor memory device is required to output the wait signal /WAIT for two clocks (FIG. 4(b)).

Generally, in the case where k-bit parallel data is read once from the memory array or written into the memory array immediately, the semiconductor memory device has to output the wait signal /WAIT in order to delay the output of the read data, when the start address is located after the end column address (k-1).

SUMMARY OF THE INVENTION

An object of the present invention is to input or output data without interruption in the continuous mode.

Another object of the present invention is to reduce power consumption in the continuous mode.

In a semiconductor memory device according to an aspect of the present invention, the semiconductor memory device has the continuous mode in which different word lines are activated in sequence and data is outputted or inputted successively. A memory core has a plurality of memory cells connected to word lines respectively. The word lines are selected according to a row address received through a row address terminal. A word control circuit first activates word lines corresponding to a start row address and a next row address in an overlapping manner in the continuous mode. Therefore, even in the case where the start address indicates the end memory cell connected to the word lines, the switch operation of the word line is not necessary, and memory cells connected to different word lines can be accessed in a sequential manner. That is, a controller that attempts to have access to a semiconductor memory device can have access to the semiconductor memory device without interrupting data. It is thus possible to prevent the data transfer rate from lowering. Furthermore, a signal and a control circuit for informing the controller of the fact that the word line is being switched are not required, whereby the construction of the semiconductor memory device and the control circuit of the controller can be simplified. This results in reduction of the system cost.

In a semiconductor memory device according to another aspect of the present invention, a row address counter generates an internal row address following the start row address, which is supplied to the address terminal, in the continuous mode. Accordingly, the word control circuit can easily activate word lines in an overlapping manner according to the row address and the internal row address.

In a semiconductor memory device according to further another aspect of the present invention, the word control circuit activates two word lines at the beginning of the continuous mode, and has access to memory cells connected to the two word lines in a sequential manner. The word control circuit then activates the word lines one by one. In this case, it is to be noted that a case where the end memory cell connected to the word line is accessed first is limited to the first access in the continuous mode. Therefore, although word lines are activated one by one after a next row address, data that are being inputted or outputted are not interrupted. The number of circuits needed to activate the word lines can be reduced, whereby power consumption of the semiconductor memory device can be reduced.

In a semiconductor memory device according to still another aspect of the present invention, a memory core is composed of a plurality of memory blocks that are selected according to the row address. A word control circuit includes a plurality of address selectors corresponding to the memory blocks respectively. Each of the address selectors is activated according to the row address, and selectively outputs one of the start row address and the next row address. Memory blocks that receive the start row address or the next row address from the address selector are activated in an overlapping manner. As described above, one of the start row address and the next row address can be supplied to predetermined memory blocks easily by means of the address selector.

In a semiconductor memory device according to still another aspect of the present invention, the lowest-order bit of the row address is used to select any one of the memory blocks. Therefore, upon change of a word line, it is possible to switch a memory block to access. That is, a memory block corresponding to a start row address and a memory block corresponding to a next row address are always different from each other. Word lines corresponding to two continuous row addresses are assigned to two different memory blocks, whereby two word lines having different row addresses can be easily activated in an overlapping manner at the beginning of access in the continuous mode. Further, the overlapped activation of the two word lines does not damage data stored in memory cells.

In a semiconductor memory device according to still another aspect of the present invention, the first control signal generator activates the overlap signal at the beginning of the continuous mode. The memory core activates a pair of memory blocks in an overlapping manner according to the start row address and the next row address when the overlap signal is received. Accordingly, the memory core can easily decide whether to activate a pair of memory blocks or one memory block. This allows the operation of the memory core to be controlled in a simple manner.

In a semiconductor memory device according to still another aspect of the present invention, the column address terminal receives a column address for selecting the memory cells connected to the word lines. The column address counter generates the internal column address following the start column address which is supplied to the column address terminal. The first control signal generator inactivates the overlap signal when the internal column address indicates the end address at the second time. Accordingly, the memory core can easily decide an inactivation timing of a pair of memory blocks activated. It is thus possible to control the operation of the memory core in a simple manner.

In a semiconductor memory device according to still another aspect of the present invention, a data bus line transfers read data or write data. A plurality of the column switches connects the memory cells to the data bus line. The first control signal generator inactivates the overlap signal in response to the turn-on operation of a column switch corresponding to the second-time end address. Therefore, the memory core can accurately decide an inactivation timing of a pair of memory blocks which are being activated. This causes the operation of the memory core to be controlled in an accurate manner.

In a semiconductor memory device according to still another aspect of the present invention, a data bus line transfers read data or write data. A plurality of the column switches connects the memory cells to the data bus line. A predetermined number of the column switches are simultaneously turned on according to an upper address indicated by high-order bits of the column address. That is, a predetermined number of column switches are turned on whenever a predetermined number of column addresses are activated, and parallel data is inputted or outputted to or from a plurality of the memory cells. Furthermore, when the upper address indicates the second-time end address, the overlap signal is inactivated. As described above, even in the case where parallel data of plural bits are inputted or outputted upon a single access to a memory block, the overlap signal can be inactivated at a correct timing.

In a semiconductor memory device according to still another aspect of the present invention, the second control signal generator outputs the block selection signal at the beginning of the continuous mode. The memory core decides a memory block to input or output data according to the logic level of the block selection signal. Accordingly, the memory core can easily decide a memory block to input or output data according to the block selection signal. The operation of the memory core can be thus controlled simply.

In a semiconductor memory device according to still another aspect of the present invention, the column address terminal receives a column address for selecting the memory cells connected to the word lines. The second control signal generator inverts the logic level of the block selection signal when the column address indicates the end address at the first time. Accordingly, the memory core can easily switch a memory block to input or output data according to the block selection signal. This makes simple controlling of the operation of the memory core.

In a semiconductor memory device according to still another aspect of the present invention, a data bus line transfers read data or write data. A plurality of the column switches connects the memory cells to the data bus line. The second control signal generator inverts the logic level of the block selection signal in response to the turn-on operation of the column switch corresponding to the first-time end address. Therefore, the memory core can accurately decide a switch timing of the memory block. As a result, the operation of the memory core can be accurately controlled.

In a semiconductor memory device according to still another aspect of the present invention, a data bus line transfers read data or write data. A plurality of the column switches connects the memory cells to the data bus line. A predetermined number of column switches are simultaneously turned on according to an upper address indicating high-order bits of the column address. The end address of the column address corresponds to the end upper address. That is, a predetermined number of column switches are turned on whenever a predetermined number of column addresses are activated, and parallel data is inputted or outputted to or from a plurality of memory cells. Further, when the upper address indicates the end address, the logic level of the block selection signal is inverted. As described above, even in the case where parallel data of plural bits are inputted and outputted upon a single access to a memory block, the block selection signal can be inverted at a correct timing.

In a semiconductor memory device according to further another aspect of the present invention, a column address terminal receives a column address for selecting a memory cell connected to word lines. A word control circuit activates two word lines in an overlapping manner when the start column address provided to the column address terminal is the end address. The word control circuit activates word lines one by one in a sequential manner when the start column address is not the end address. The number of circuits needed to activate word lines according to the start column address can be reduced so that power consumption of the semiconductor memory device can be significantly reduced.

In a semiconductor memory device according to still another aspect of the present invention, the first control signal generator activates the overlap signal according to the start column address and the next row address, in case that the start column address is the end address. The memory core activates a pair of memory blocks in an overlapping manner when receiving the overlap signal. Accordingly, the memory core can easily decide whether to activate a pair of memory blocks or one memory block. It is thus possible to control the operation of the memory core in a convenient manner.

In a semiconductor memory device according to still another aspect of the present invention, the second control signal generator outputs the block selection signal in case that the start column address is the end address. The memory core decides a memory block to input or output data according to the logic level of the block selection signal. Accordingly, the memory core can easily decide a memory block to input or output data according to the block selection signal. The operation of the memory core can be thus controlled simply.

In a semiconductor memory device according to still another aspect of the present invention, the second control signal generator inverts the logic level of the block selection signal in response to an access corresponding to the end address. Therefore, the memory core can easily switch a memory block to input or output data according to the block selection signal. This allows the operation of the memory core to be controlled simply.

In a semiconductor memory device according to still another aspect of the present invention, a data bus line transfers read data or write data. A plurality of column switches connects the memory cells to the data bus line. The second control signal generator inverts the logic level of the block selection signal in response to the turn-on operation of the column switch corresponding to the end address. Thus, the memory core can decide a switch timing of a memory block to input or output data accurately. As a result, the operation of the memory core can be accurately controlled.

In a semiconductor memory device according to still another aspect of the present invention, a data bus line transfers read data or write data. A plurality of column switches connects the memory cells to the data bus line. A predetermined number of column switches are simultaneously turned on according to an upper address indicated by high-order bits of the column address. That is, a predetermined number of column switches are turned on whenever a predetermined number of column address are activated, and parallel data is inputted or outputted to or from a plurality of memory cells. Accordingly, even in the case where parallel data of plural bits are inputted and outputted upon a single access to a memory block, data can be inputted and outputted without interrupting data.

In a semiconductor memory device according to further another aspect of the present invention, a column address terminal receives a column address for selecting a memory cell connected to word lines. A memory core is composed of a plurality of memory blocks that are selected by a row address. During the normal operation mode in which the read operation or the write operation is performed in the continuous mode and whenever an access command is issued, a pair of memory blocks selected according to the row address is activated in an overlapping manner. The word control circuit activates one of the word lines in one of the memory blocks which is activated according to the start row address, and activates another one of the word lines in the other of the memory blocks which is activated, according to a next start row address, in case that the start column address is the end address in the continuous mode. For this reason, in a semiconductor memory device in which a pair of memory blocks keeps active during the access operation, even in the case where a start column address indicates the end memory cell connected to the word lines, memory cells connected to two word lines having consecutive addresses can be accessed in a sequential manner. In other words, when accessing a semiconductor memory device, a controller can access without data interruption. It is thus possible to prevent the data transfer rate from lowering.

In a semiconductor memory device according to still another aspect of the present invention, the word control circuit activates the word lines of the pair of the memory blocks according to the start row address and the next row address, respectively, when the column address is the end address, and has access to memory cells connected to the word lines in a sequential manner. The word control circuit then activates the word lines of the pair of the memory blocks according to the same row address, respectively. A case where the end memory cell connected to the word line is first accessed is limited to the first access in the continuous mode. As described above, following a next row address, word lines of a pair of memory blocks can be activated according to the same row address, in the same manner as that during the normal operation mode. This simplifies the construction of the word control circuit.

In a semiconductor memory device according to still another aspect of the present invention, the first control signal generator activates the overlap signal in case that the start column address is the end address. The word control circuit supplies the start row address and the next row address to the pair of the memory blocks, respectively, when the overlap signal is received. Accordingly, the word control circuits can easily decide a memory block that is being activated according to the overlap signal. This causes the operation of the word control circuit to be controlled simply.

In a semiconductor memory device according to still another aspect of the present invention, the first control signal generator inactivates the overlap signal in response to access corresponding to the end address. Accordingly, the word control circuit can easily decide an inactivation timing of a pair of memory blocks that are being activated. It is therefore possible to control the operation of the word control circuit in a simple manner.

In a semiconductor memory device according to still another aspect of the present invention, a data bus line transfers read data or write data. A plurality of column switches connects the memory cells to the data bus line. The first control signal generator inactivates the overlap signal in response to the turn-on operation of the column switch corresponding to the end address. Therefore, the word control circuit can decide an inactivation timing of a pair of memory blocks that are being activated in an accurate manner. This allows the operation of the word control circuit to be accurately controlled.

In a semiconductor memory device according to further another aspect of the present invention, a word control circuit simultaneously activates word lines corresponding to a row address and a next row address. Since two word lines are simultaneously activated, the construction of the word control circuit can be simplified.

In a semiconductor memory device according to still another aspect of the present invention, a clock terminal receives a clock. A data terminal outputs read data output from a memory cell, and inputs write data to the memory cell. The read data is sequentially outputted to the data terminals in synchronization with a clock, and the write data is sequentially inputted to the data terminals in synchronization with a clock. Even in a semiconductor memory device of the clock sync mode, data can be input or output without interrupting data.

BRIEF DESCRIPTION OF THE DRAWINGS

The nature, principle, and utility of the invention will become more apparent from the following detailed description when read in conjunction with the accompanying drawings in which like parts are designated by identical reference numbers, in which:

FIG. 8 is an explanatory view illustrating the relation between a start address supplied in the continuous mode and an activated memory block according to the first embodiment;

FIG. 14 is an explanatory view illustrating the outline of the operation in the continuous mode according to the third embodiment;

FIG. 15 is an explanatory view illustrating the relation between a start address supplied in the continuous mode and an activated memory block according to the third embodiment;

DESCRIPTION OF THE PREFERRED EMBODIMENTS

Figure 1:
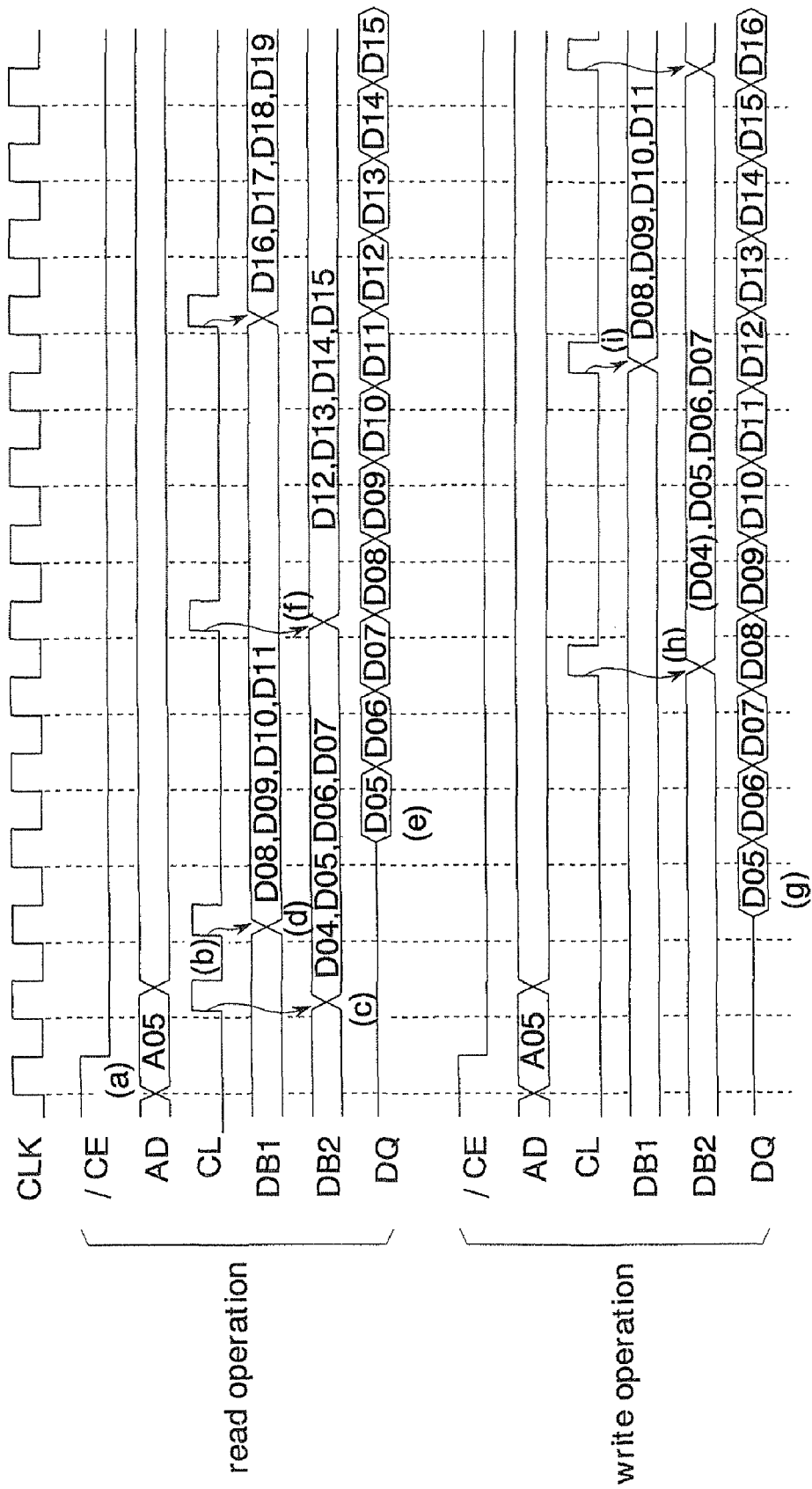
FIG. 1 is a timing diagram of an example of the read operation and write operation of a semiconductor memory device having the conventional continuous mode.
Figure 2:
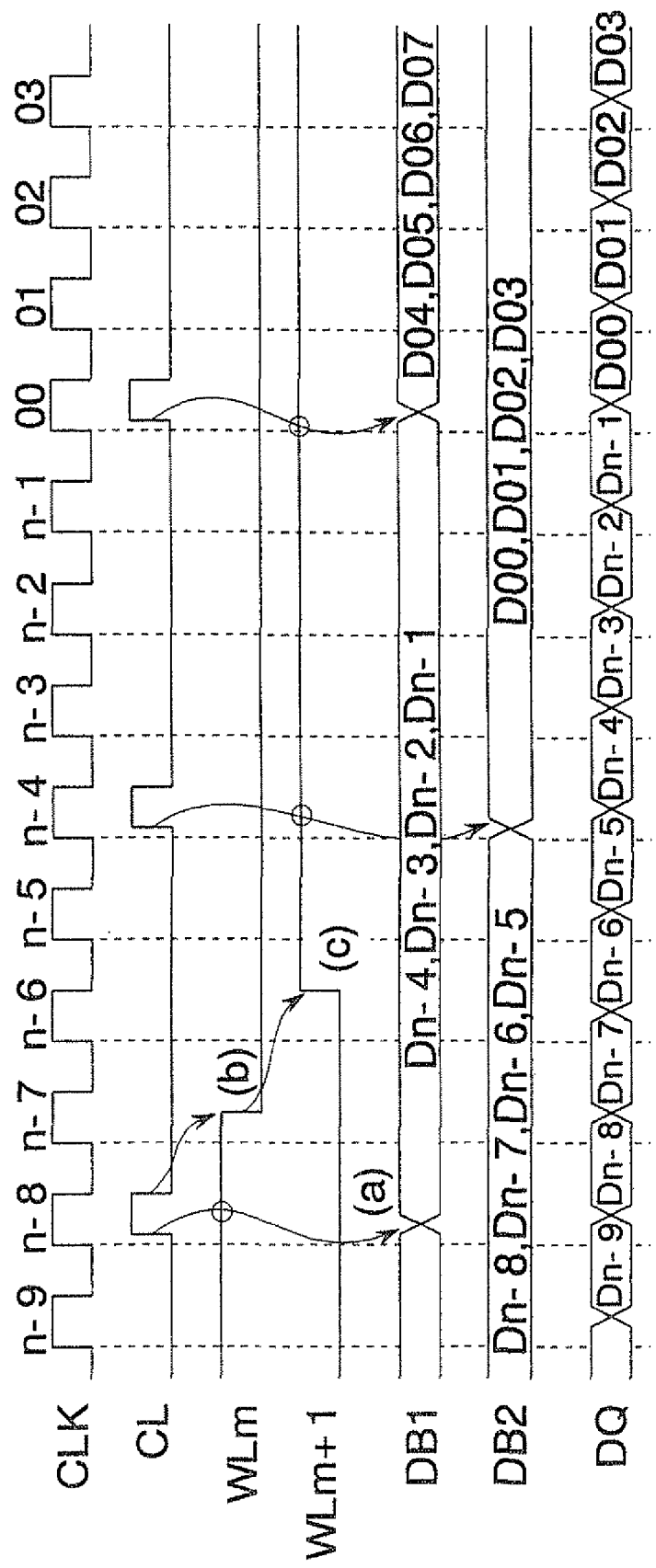
FIG. 2 is a timing diagram of an example of the switch operation of the word line in the conventional continuous read operation.
Figure 3:
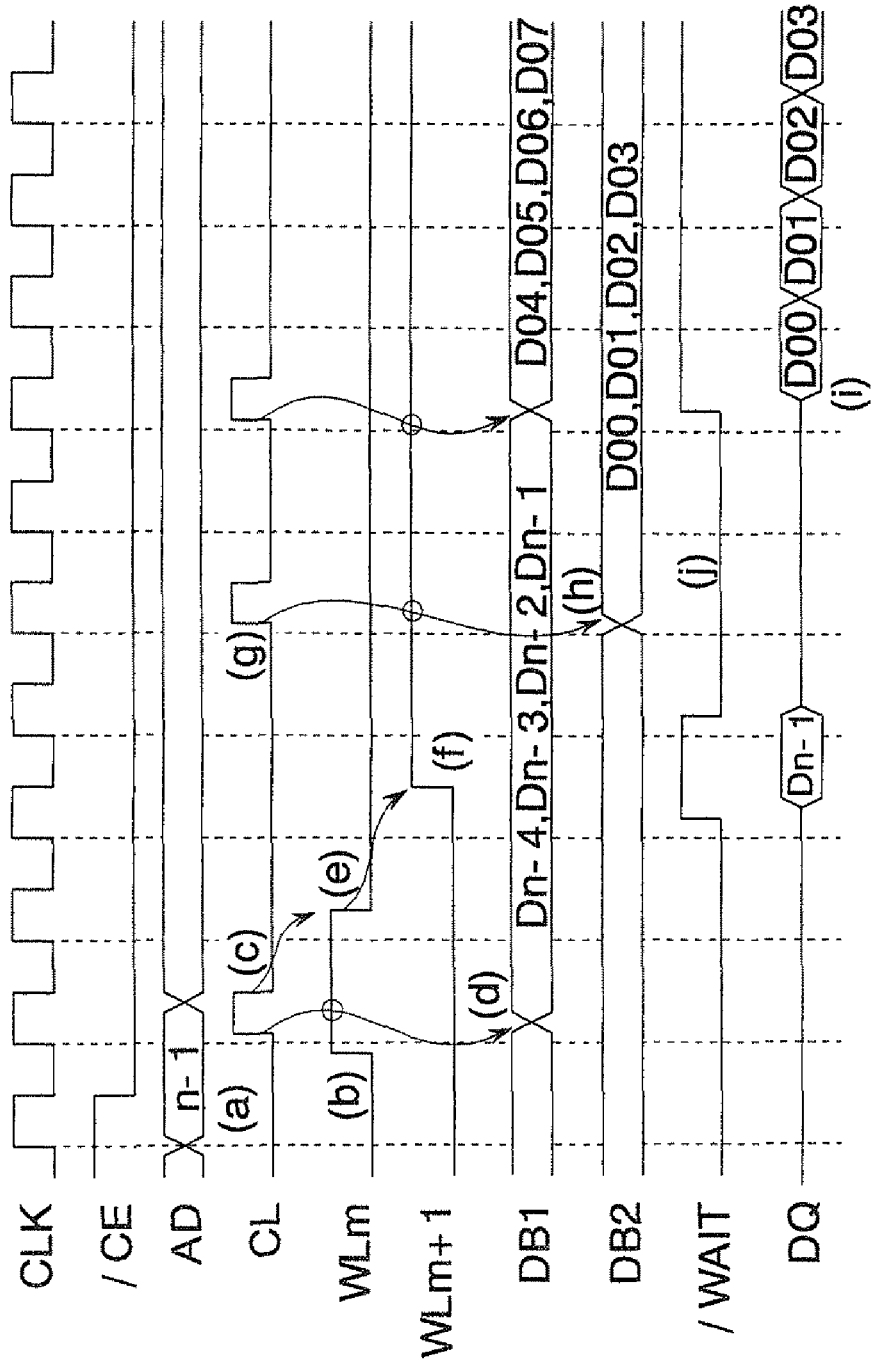
FIG. 3 is a timing diagram of another example of the switch operation of the word line in the conventional continuous read operation.
Figure 4:
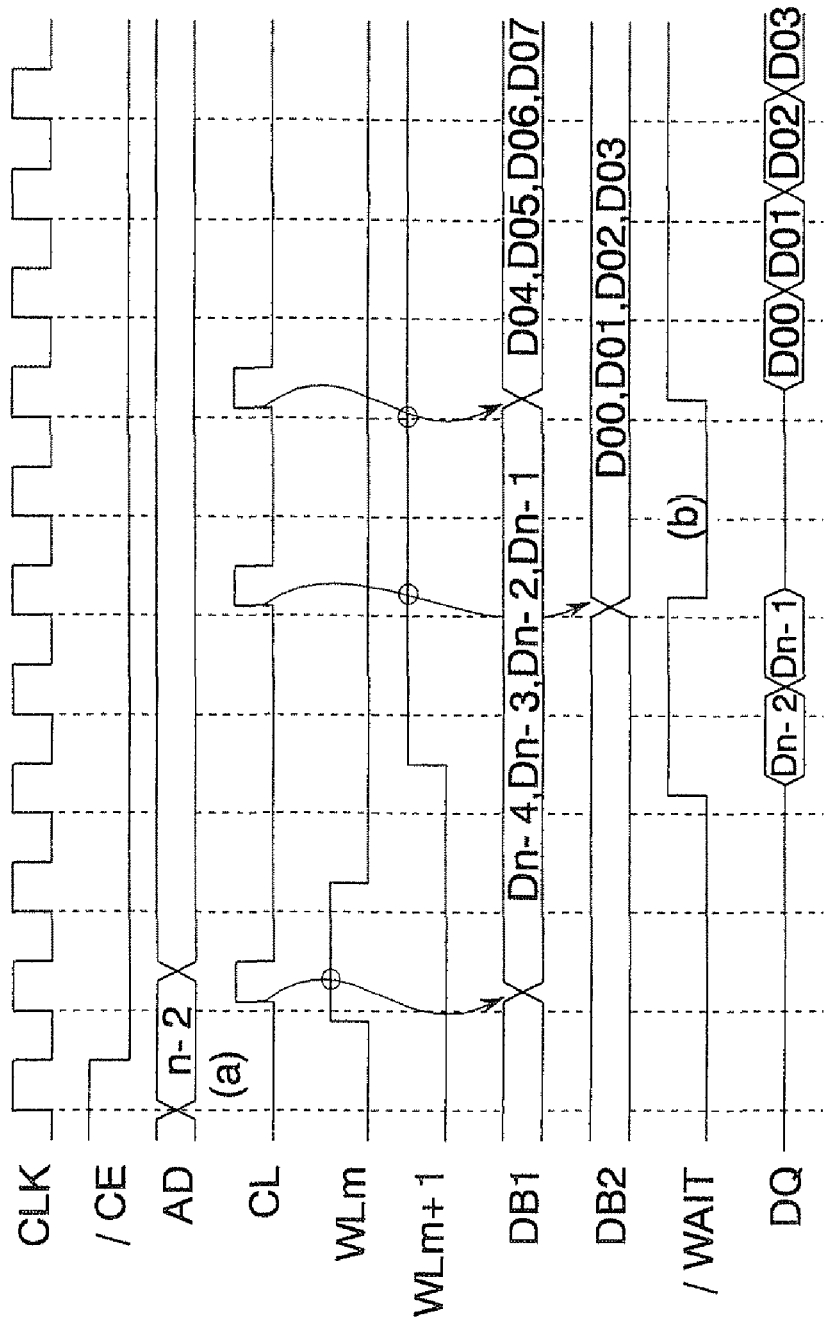
FIG. 4 is a timing diagram of still another example of the switch operation of the word line in the conventional continuous read operation.

Hereinafter, embodiments of the invention will be described with reference to the accompanying drawings. In the drawings, dual circles designate external terminals. Signals supplied through the external terminals have the same reference numerals as names of the terminals. Furthermore, in the drawings, signal lines indicated by a bold line are plural in numbers. A part of a block to which a bold line is connected is composed of a plurality of circuits. Signals having "z" attached to their ends indicate a positive logic level. Signals having "/", attached to their heads and "x" attached to their ends indicate a negative logic level.

Figure 5:
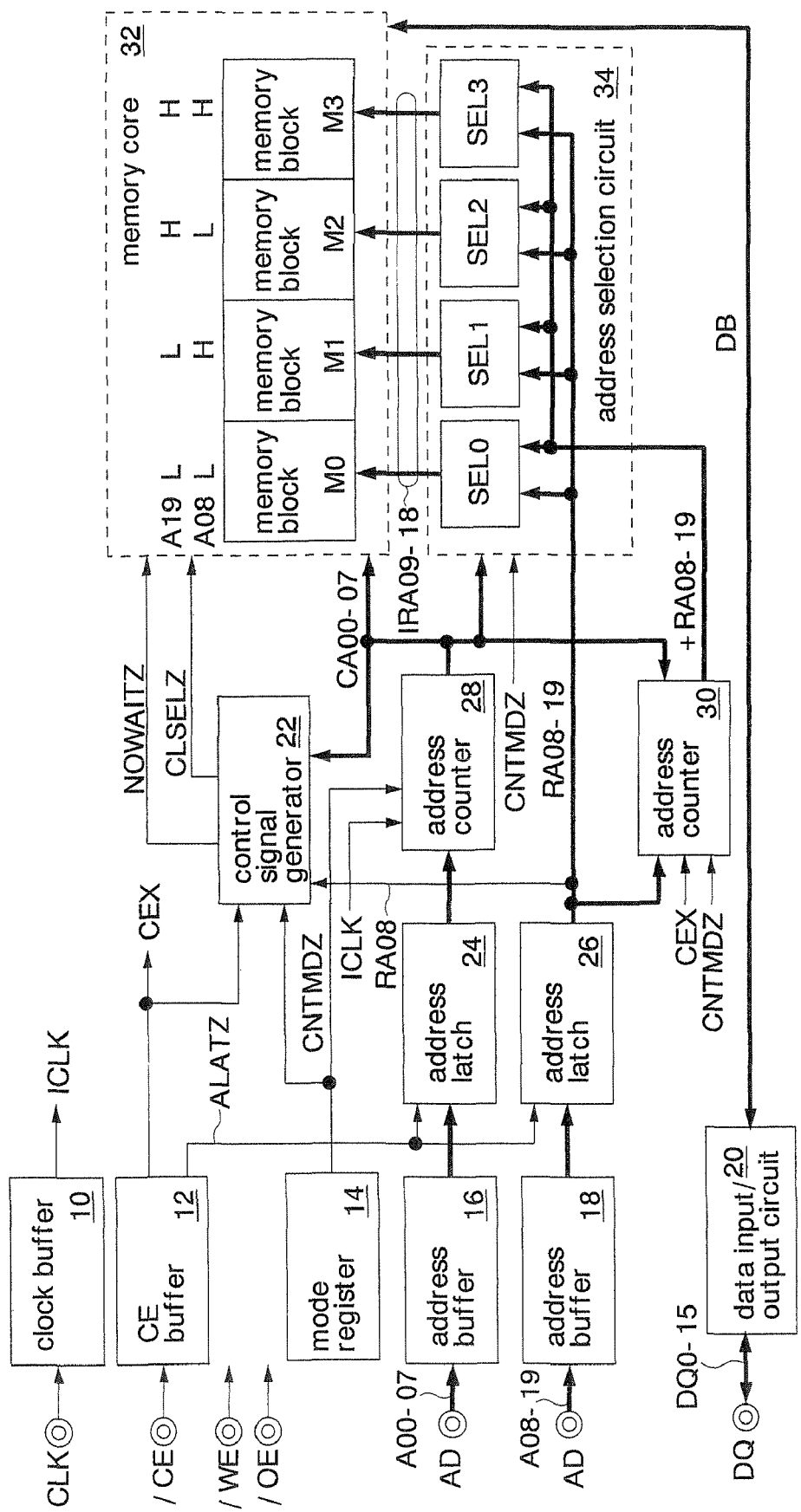
FIG. 5 is a block diagram of a semiconductor memory device according to a first embodiment of the present invention.

FIG. 5 is a block diagram of a semiconductor memory device according to a first embodiment of the invention.

The semiconductor memory device is formed on a silicon substrate as a clock synchronous type of FCRAM (Fast Cycle RAM) by means of a CMOS process. The FCRAM adopts a SDR method in which data is inputted/output in synchronization with a rising edge of a clock signal CLK, as shown in FIG. 1.

The FCRAM includes a clock buffer 10, a CE buffer 12, a mode register 14, address buffers 16 and 18, a data input/output circuit 20, a control signal generator 22, address latches 24 and 26, address counters 28 and 30, a memory core 32, and an address selection circuit 34.

The FCRAM includes a normal operation mode and a continuous mode as operation modes. In the normal operation mode, a read or write operation is performed once whenever a read or write command is issued. In the continuous mode, a plurality of read or write operations are continuously performed according to a start address supplied together with the read or write command. Addresses subsequent to the start address are sequentially generated by the address counters 28 and 30.

The clock buffer 10 receives a clock signal CLK through an external terminal CLK, and outputs the received signal as an internal clock signal ICLK. The internal clock signal ICLK is supplied to a CE buffer 12 and a data input/output circuit 20, etc. The CE buffer 12 receives a chip enable signal /CE through an external terminal /CE, and outputs an internal chip enable signal CEX and an address latch signal ALATZ. Although not shown in the drawings, the FCRAM further includes an input buffer that receives a write enable signal /WE and an output enable signal /OE.

The mode register 14 is set according to a data signal DQ or an address signal AD, which is provided together with a mode register set command. The mode register set command is recognized when a combination of the chip enable signal /CE, the write enable signal /WE, and the output enable signal /OE, which are not used in the normal operation mode, is received. The mode register 14 activates a continuous mode signal CNTMDZ when the operation mode is set to the continuous mode in which the data signal DQ is continuously inputted and outputted. In the mode register 14, CAS latency is set in addition to the continuous mode. The CAS latency is the number of clocks from the time when a read command is received to the time when a data is outputted.

The address buffer 16 receives low-order bits A00-07 (column addresses) of an address signal composed of plural bits through the address terminal AD (column address terminal), and outputs the received signal to the address latch 24. The column addresses A00-07 are supplied to select a memory cell MC connected to the word lines WL shown in FIG. 6 to be described later.

The address buffer 18 receives high-order bits A08-19 (row addresses) of an address signal composed of plural bits through the address terminal AD (row address terminal), and outputs the received signal to the address latch 26. The row addresses A08-19 are supplied to select the word lines WL shown in FIG. 6 to be described later. The FCRAM according to the present embodiment adopts an address of a non-multiplex method in which row addresses and column addresses are simultaneously inputted.

The data input/output circuit 20 receives data read from the memory core 32 through the data bus line DB, and outputs the received read data to the data terminal DQ (DQ0-15). Further, the data input/output circuit 20 receives write data through the data terminal DQ (DQ0-15), and outputs the received data to the memory core 32 through the data bus line DB.

The data input/output circuit 20 includes a parallel/serial conversion circuit and a serial/parallel conversion circuit not shown, and a read data latch and a write data latch corresponding to those circuits. The parallel/serial conversion circuit converts parallel data, which are read to the data bus line DB from the memory core 32 and latched in the data latch, into serial data. The serial/parallel conversion circuit converts serial write data, which is sequentially supplied from the data terminal DQ, into parallel data to latch it in the data latch.

The control signal generator 22 operates in the continuous mode, and outputs a no-wait signal NOWAITZ and a column selection signal CLSELZ according to the chip enable signal CEX and the column addresses CA00-07. The no-wait signal NOWAITZ shifts to a high level when two memory blocks M (two of M0 to M3) are simultaneously activated. The column selection signal CLSELZ is outputted according to the logic level of the row address RA08 to designate a block, which outputs or inputs the data signal DQ, among the two memory blocks M that are simultaneously activated. The control signal generator 22 operates as a first control signal generator that activates a no-wait signal NOWAITZ (overlap signal), and as a second control signal generator that activates the column selection signal CLSELZ (a block selection signal).

The address latch 24 latches the column addresses A00-07 in synchronization with the address latch signal ALATZ, and outputs the latched addresses to the address counter 28. The address latch 26 latches the row addresses A08-19 in synchronization with the address latch signal ALATZ, and outputs the latched addresses to the address counter 28 and the address selection circuit 34.

The address counter 28 (a column address counter) outputs the column addresses A00-07 as the column addresses CA00-07 at the beginning of the continuous mode and during the normal operation mode. The address counter 28 also increases the column addresses CA00-07 by "1" in synchronization with the internal clock signal ICLK in the continuous mode (CNTMDZ=a high level), and outputs the addresses as the internal column addresses. That is, the address counter 28 sequentially generates the internal column addresses that follow the start column addresses A00-07.

The address counter 30 (a row address counter) operates according to activation of the internal chip enable signal CEX in the continuous mode. The address counter 30 outputs addresses in which the row addresses RA08-19 are increased by "1" as row addresses +RA08-19 (internal row addresses) at the beginning of the continuous read operation or the continuous write operation. The address counter 30 then increases the row addresses +RA08-19 by "1" whenever it determines that the end column selection signal CL has been activated according to the column addresses CA00-07.

The memory core 32 is composed of four memory blocks M0 to M3. The memory blocks M0 to M3 are selected in response to the highest-order bit A19 and the lowest-order bit A08 of the row address RA. The memory core 32 executes the read operation or the write operation in response to the row addresses RA0-19, the column addresses CA00-07 and an operation control signal output from an operating control circuit (not shown), in the continuous mode and the normal operation mode. The operation control signal can include a basic timing signal RASZ that performs an access operation to the memory blocks M0 to M3, a word line activation signal WTZ that activates the word lines WL, latch enable signals LEX and /LEX that activate sense amplifiers, a precharge signal BRSX that precharges bit lines, or the like. The memory core 32 operates in response to the no-wait signal NOWAITZ and the column selection signal CLSELZ in the continuous mode. The details of the memory blocks M0 to M3 are shown in FIG. 6.

The address selection circuit 34 has address selectors SEL0-SEL3 corresponding to the memory blocks M0 to M3, respectively. During the normal operation mode, any one of the address selectors SEL0-SEL3 are activated in response to the row addresses RA08 and RA19. The activated address selector SEL outputs the row addresses RA09-18 as row addresses IRA09-18. At the start of the continuous mode, two of the address selectors SEL0-SEL3 are activated in response to the row addresses RA08 and RA19. The two activated address selectors SEL output the row addresses RA09-18 (or the row addresses +RA09-18) as row addresses IRA09-18, respectively. In other words, at the start of the continuous mode, two memory blocks are simultaneously accessed, and the word lines WL in response to the row addresses IRA09-18 are activated. As such, the address selection circuit 34 operates as a word control circuit that activates the word lines WL corresponding to the start row address RA09-18 and the next row addresses +RA09-18 in an overlapping manner in the continuous mode.

Thereafter, the address selection circuit 34 inactivates one of the address selectors SEL0-SEL3 when it determines that the end column selection circuit CL has been activated twice by the column addresses CA00-07. The activated address selector SEL outputs the row addresses +RA09-18 as row addresses IRA09-18. Further, one memory block is accessed in a sequential manner.

Figure 6:
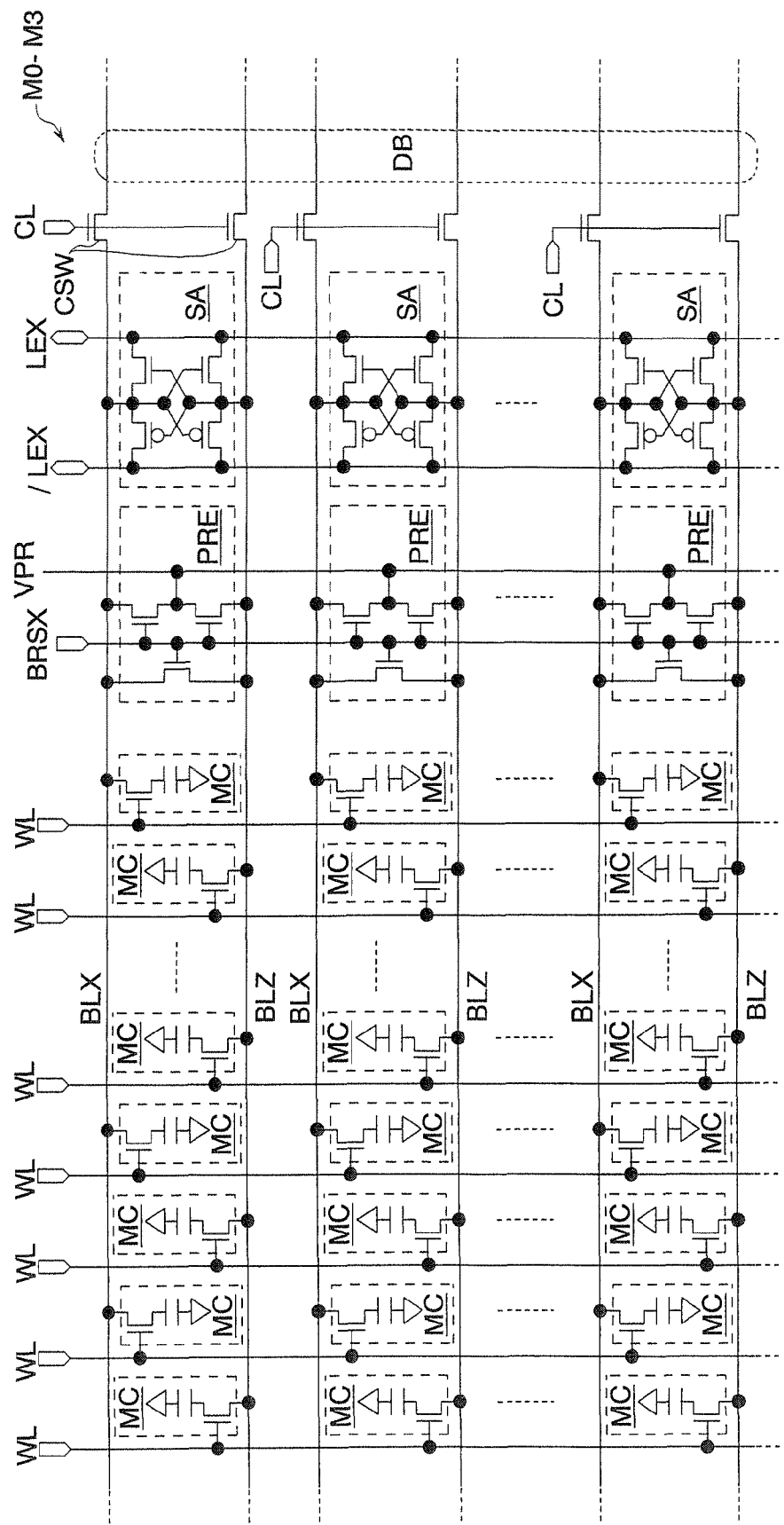
FIG. 6 is a detailed circuit diagram of main elements of memory blocks M0 to M3 shown in FIG. 5.

FIG. 6 is a detailed circuit diagram of main elements of the memory blocks M0 to M3 shown in FIG. 5.

Each of the memory blocks M0 to M3 includes a plurality of dynamic memory cells MC arranged in the form of matrix, a plurality of word lines WL arranged in the longitudinal direction in the drawing, and a plurality of bit line pairs BLZ and BLX arranged in the lateral direction in the drawing. The memory cells MC include a transfer transistor having a gate connected to the word line WL, and a capacitor connected to the bit line BLZ or BLX through the transfer transistor.

Each of the precharge circuits PRE includes an nMOS transistor for connecting the pair of the bit lines BLZ and BLX to a precharge line VPR, respectively, and an nMOS transistor that equalizes the pair of the bit lines BLZ and BLX. The gate of the nMOS transistor receives a bit line reset signal BRSX. The precharge line VPR is set to, for example, an intermediate voltage between an internal supply voltage and a ground voltage.

Each of the sense amplifiers SA includes a pair of CMOS inverters whose inputs and outputs are interconnected. The inputs of the CMOS inverters are connected to the bit lines BLZ and BLX, respectively. The source of the pMOS transistor of the CMOS inverter is connected to a latch enable signal /LEX in which the logic level of the latch enable signal LEX is inverted. The source of the nMOS transistor of the CMOS inverter is connected to the latch enable signal LEX.

The sense amplifiers SA are activated when the latch enable signals /LEX and LEX are in a logic high level and a logic low level, respectively, and serve to amplify a voltage difference between the bit lines BLZ and BLX, and then to latch the amplified logic level. The data amplified by the sense amplifiers SA are transferred to the data bus line DB through the column switch CSW during the read operation, and are written into the memory cells MC through the bit line BLZ (or BLX) during the write operation. The column switch CSW is turned on during a high level of the column selection signal CL that is generated according to a decode signal of the column address signals CA00-07. In the present embodiment, in each of the memory blocks M0 to M3, four column switches CSW are selected immediately by the column selection signal CL for every data terminal DQ, and 4-bit parallel data is read out to the data bus line DB from the memory cells MC, or written into the memory cells MC from the data bus line DB.

Figure 7:
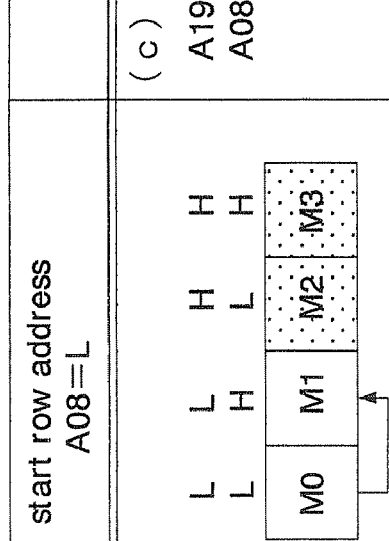
FIG. 7 is an explanatory view illustrating the outline of the operation in the continuous mode according to the first embodiment.

FIG. 7 shows the outline of the operation in the continuous mode according to the first embodiment.

The memory block M0 or M2 is first accessed, as shown in FIGS. 7(a) and 7(b), when the lowest-order bit A08 of the start row address RA, which is supplied together with the access command, at the beginning of the continuous mode is at "L (a low level)". That is, a predetermined word line WL (A) within the memory block M0 or M2 is selected.

In the present embodiment, the memory blocks M0 to M3 are identified using the lowest-order bit A08 of the row address RA, whereby a word line WL(A+1) that has to be selected next exists in the memory block M1 or M3 on the right side. Accordingly, when the access in the continuous mode begins, the word lines WL in the memory blocks M0 and M1 are simultaneously activated (FIG. 7(a)), or the word lines WL in the memory blocks M2 and M3 are simultaneously activated (FIG. 7(b)) by the address selection circuit 34.

The memory block M1 or M3 is first accessed, as shown in FIGS. 7(c) and 7(d), when the lowest-order bit A08 of the start row address RA is at "H (a high level)" and all of the remaining bits A09-18 are not at "H (a high level)". In other words, a word line WL(A) that has to be selected first exists in the memory block M1 or M3, and a word line WL(A+1) to be selected next exist in the memory block M0 or M2 on the left side. Accordingly, when the access in the continuous mode begins, the word lines WL in the memory blocks M1 and M0 are simultaneously activated (FIG. 7(c)), or the word lines WL in the memory blocks M3 and M2 are simultaneously activated (FIG. 7(d)) by the address selection circuit 34.

When all of the bits A08-18 of the start row address RA are at "H", the word lines WL in the memory blocks M1 and M2 are simultaneously activated (FIG. 7(e)) by the address selection circuit 34 when the access in the continuous mode begins, in the same manner as described above, or the word lines WL in the memory blocks M3 and M0 are simultaneously activated (FIG. 7(f)).

FIG. 8 shows the relationship between the start address supplied in the continuous mode and an activated memory block.

For example, when the highest-order bit A19 of the start row address RA is at "L", the word lines WL in the memory blocks M0 and M1 are simultaneously activated, and the read operation or the write operation is performed (corresponding to FIGS. 7(a) and 7(c)). In the same manner as described above, when the highest-order bit A19 of the start row address RA is at "H", the word lines WL in the memory blocks M2 and M3 are simultaneously activated, and the read operation or the write operation is performed (corresponding to FIGS. 7(b) and 7(d)).

When the highest-order bit A19 shifts from "L" to "H", the word lines WL in the memory blocks M1 and M2 are simultaneously activated (corresponding to FIG. 7(e)). When the highest-order bit A19 shifts from "H" to "L", the word lines WL in the memory blocks M3 and M0 are simultaneously activated (corresponding to FIG. 7(f)).

Figure 9:
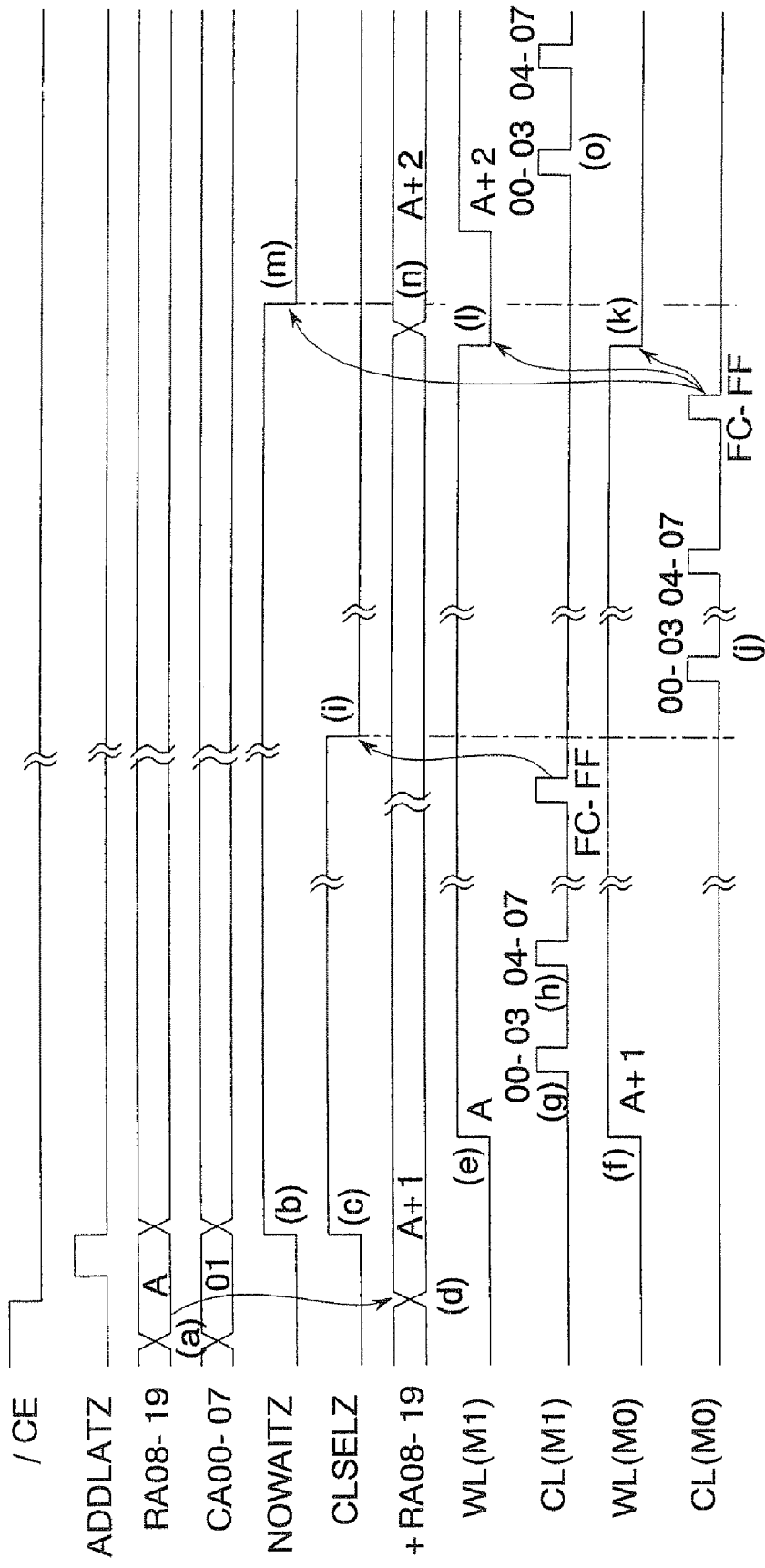
FIG. 9 is a timing diagram of an example of the operation in the continuous mode according to the first embodiment.

FIG. 9 shows an example of the operation in the continuous mode according to the first embodiment.

In this example, information indicating the continuous mode is stored in advance in the mode register 14 shown in FIG. 5. The mode register 14 serves to activate the continuous mode signal CNTMDZ. The FCRAM starts the continuous read operation or the continuous write operation when it detects that the chip enable signal /CE shifts to a low level in synchronization with the clock signal CLK (not shown). Specifically, when the write enable signal /WE is at a high level, the continuous read operation begins. When the write enable signal /WE is at a low level, the continuous write operation begins.

For example, the FCRAM receives the row addresses RA08-19="A" and the column addresses CA00-07="01" (hexadecimal number) which indicates the memory block M1, together with the chip enable signal /CE when it is first accessed in the continuous mode (FIG. 9(a)). The control signal generator 22 activates the no-wait signal NOWAITZ and the column selection signal CLSELZ to a high level in synchronization with a falling edge of the chip enable signal /CE (FIGS. 9(b) and 9(c)).

The column selection signal CLSELZ shifts to a high level or a low level according to the logic level of the lowest-order bit RA08 of the row address. For instance, when the column selection signal CLSELZ is at a high level, the memory block M1 or M3 is accessed. When the column selection signal CLSELZ is at a low level, the memory block M0 or M2 is accessed. In this example, the start row address "A" indicates the memory block M1, whereby the column selection signal CLSELZ shifts to a high level at the beginning of the continuous access.

The address counter 30 is activated by the chip enable select signal CEX at a low level and the continuous mode signal CNTMDZ at a high level to output a row address "A+1(+RA08-19)" in which the row address "A" is increased by "1" (FIG. 9(d)). The row address "A+1" is an address for indicating the memory block M0. The address selection circuit 34 receives the row addresses "A" and "A+1" to select two address selectors SEL0 and SEL1. The address selection circuit 34 outputs the row address "A(IRA09-18)" from the address selector SEL1, and outputs the row address "A+1 (IRA09-18)" from the address selector SEL0.

The memory core 32 operates in response to a control signal, such as the basic timing signal RASZ output from the operating control circuit. The memory core 32 receives activation of the no-wait signal NOWAITZ, and activates the memory blocks M0 and M1, respectively, corresponding to the address selectors SEL0 and SEL1. The memory block M1 activates the word lines WL corresponding to the row address "A" (FIG. 9(e)). The memory block M0 activates the word lines WL corresponding to the row address "A+1" (FIG. 9(f)). The memory blocks M0 and M1 activate simultaneously (overlappingly) the word lines WL, and activates simultaneously the sense amplifiers SA. For example, when the continuous access is the read access, data is read in the bit line BLZ or BLX from the memory cell MC in response to selection of the word lines WL, and the sense amplifiers SA amplifies the amount of signal of the data.

The memory core 32 then receives the column selection signal CLSELZ at a high level, and activates the column selection signal CL corresponding to the start column addresses 00-03 (hexadecimal number) (FIG. 9(g)). As shown in FIG. 1, a single activation of the column selection signal CL causes 4-bit read data per one data terminal DQ to be sequentially outputted to the data terminal DQ in synchronization with the clock signal CLK (the read operation). Or, a single activation of the column selection signal CL causes 4-bit read data per one data terminal DQ to be sequentially inputted to one data terminal DQ in synchronization with the clock signal CLK (the write operation). That is, four column switches CSW per one data terminal DQ are simultaneously turned on in response to the high-order bits A02-07 of the column address. Thereafter, the column selection signals CL corresponding to following column addresses 04-07, 08-11, . . . are activated in a sequential manner, and access to the memory core M1 is then performed (FIG. 9(h)).

The control signal generator 22 inverts the logic level of the column selection signal CLSELZ when it detects that the column selection signal CL (the end column selection signal) corresponding to the first-time end column addresses FC-FF is activated (FIG. 9(i)). In other words, the column selection signal CLSELZ inverts the logic level in response to the turn-on operation of the column switch CSW by the first-time end column selection signal. As the column selection signal CLSELZ varies, the memory block M that inputs or output data is switched. Furthermore, the column selection signals CL are sequentially provided to the memory block M0 corresponding to the row address "A+1" (FIG. 9((j)), and data is outputted or inputted to or from the memory block M0.

If the end column selection signal CL corresponding to the end column addresses FC-FF is activated again, access to two word lines WL (A, A+1) that are being activated is completed. Accordingly, the two word lines WL are all inactivated (FIGS. 9(k) and 9(l)). The control signal generator 22 also detects that the column selection signal CL corresponding to the end column addresses FC-FF is activated again, and inactivates the no-wait signal NOWAITZ to a low level (FIG. 9(m)). That is, the control signal generator 22 inactivates the no-wait signal NOWAITZ in response to the second-time end column selection signal CL in the continuous mode.

The address counter 30 increases the row address +RA08-19 by "1", thus making it "A+2", when it detects that the column selection signal CL corresponding to the end column addresses CA00-07 is activated twice while the no-wait signal NOWAITZ is being activated (FIG. 9(n)). The word lines WL in the memory block M1 corresponding to the row address "A+2" of the row address are activated, and data is outputted or inputted to or from the memory block M1 in a sequential manner (FIG. 9(o)). That is, at the beginning of the continuous mode, two word lines WL are activated, and the word lines WL are activated one by one thereafter.

Thereafter, whenever the column selection signal CL corresponding to the end column addresses FC-FF is activated, the row addresses +RA08-19 are increased by "1". In more detail, the address counter 30 increases the row addresses +RA08-19 by "1" whenever the column selection signal CL corresponding to the end column addresses CA00-07 is activated while the no-wait signal NOWAITZ is being activated. Data is then input or output to or from the data terminal DQ without being interrupted.

Figure 10:
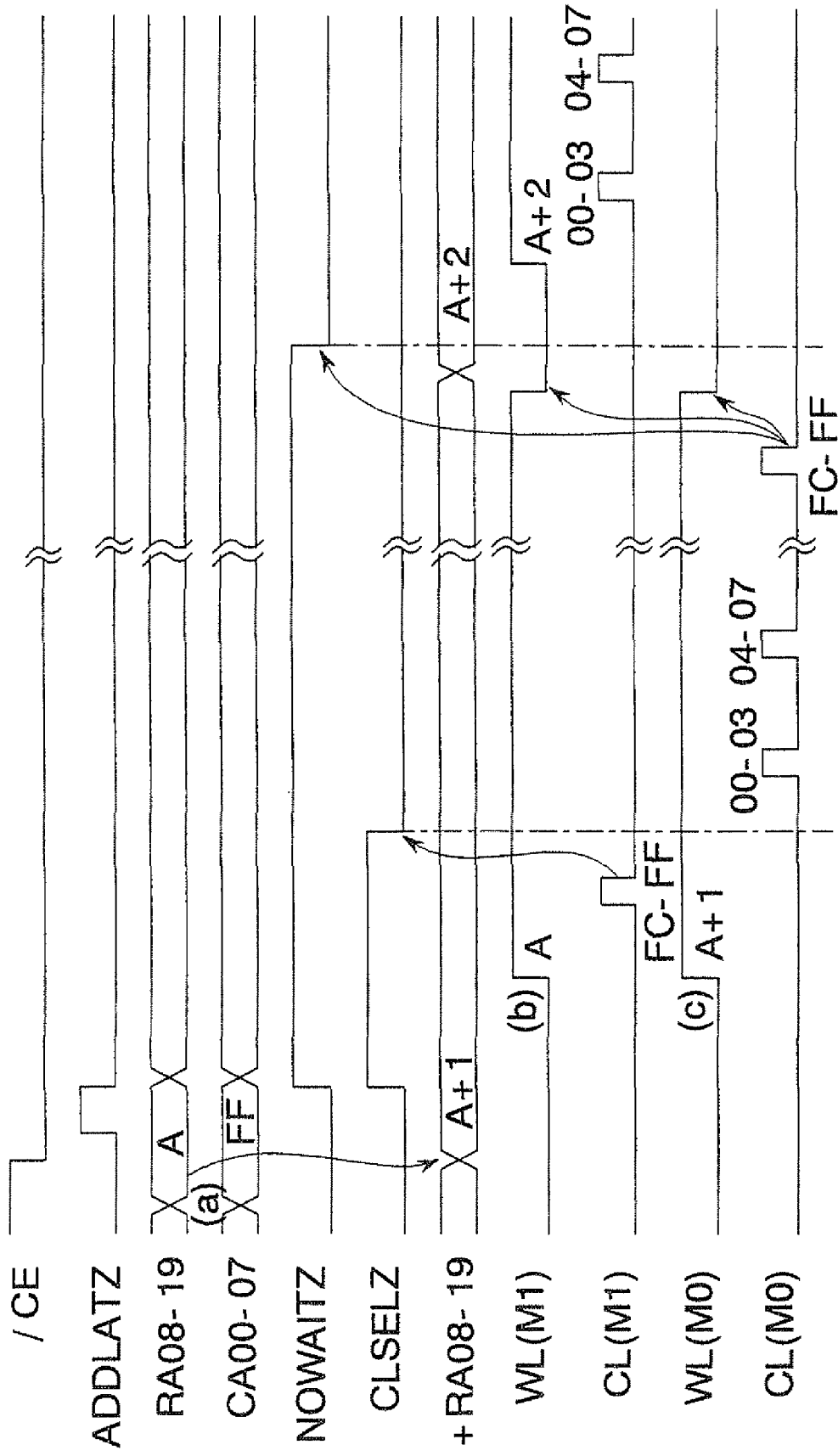
FIG. 10 is a timing diagram of another example of the operation in the continuous mode according to the first embodiment.

FIG. 10 shows another example of the operation in the continuous mode according to the first embodiment. Description will not be given on the same operation as that of FIG. 9, for simplicity.

In this example, the start row addresses RA 08-19, which are supplied when it is first accessed in the continuous mode, indicate the memory block M1, in the same manner as FIG. 9. The start column address addresses CA00-07 are FF (hexadecimal number) corresponding to the end column selection signal CL (FIG. 10(a)).

In the same manner as FIG. 9, two word lines WL of different memory blocks M1 and M2 are simultaneously activated at the beginning of the continuous access (FIGS. 10(b) and 10(c)). For example, in the read operation, a word line WL corresponding to the start row address "A" is activated with activation of a word line WL corresponding to a next row address "A+1". Sense amplifiers SA of the memory blocks M1 and M0 are activated, and read data is amplified, simultaneously.

In other words, even in the case where start 4-bit read data is located over different word lines WL, the entire read data could be amplified in advance. Accordingly, read data can be outputted to the data terminal DQ without being interrupted.

Also in the write operation, the word lines WL corresponding to the start row address "A" and the word line WL corresponding to the next row address "A+1" are simultaneously activated. Thus, write data can be inputted consecutively even in the case where start 4-bit write data is located over different word lines WL.

After the column selection signal CLSELZ corresponding to the end column address (FC-FF of hexadecimal number) of the memory block M1 is activated, the FCRAM operates at the same timing as in FIG. 9.

As described above, in the present embodiment, in the continuous mode, the word lines WL corresponding to the start row address RA and the next row address +RA are activated in an overlapping manner. Accordingly, even in the case where the start column address CA indicates the end memory cell MC connected to the word lines WL, the switch operation of the word lines WL is not necessary. Therefore, the controller which controls FCRAM can be accessed without interrupting data. It is therefore possible to prevent the data transfer rate from lowering.

Since a wait signal informing the controller of the fact that the word line WL is being switched and a control circuit thereof are not necessary, the construction of a FCRAM and a control circuit of the controller can be simplified. This leads to reduction of the system cost.

As the internal row addresses +RA following the start row address RA are sequentially generated by the address counter 30, the word lines WL can be activated easily in an overlapping manner in response to the internal row address +RA following the start row address RA.

Only at the beginning of the continuous mode, two word lines WL are activated, and word lines WL are then activated one by one. The number of word lines WL that are activated decreases to the minimum to thereby reduce power consumption of the FCRAM.

The start row address RA or the internal row address +RA can be easily selected by the simplified address selectors SEL0-SEL3, and are then outputted to the memory block M.

The lowest-order bit A08 of the row address RA is used to select the memory block M. For this reason, the word lines WL corresponding to continuous two row addresses RA can be allocated to different memory blocks M separately. Therefore, when it is first accessed in the continuous mode, different two word lines WL of the row address RA can be easily activated in an overlapping manner. Furthermore, though the two word lines WL are activated overlappingly, data stored in the memory cells Mc are not likely to be destroyed.

The memory core 32 can easily decide on a memory block M, which will be activated by the no-wait signal NOWAITZ generated by the control signal generator 22. This allows the operation of the memory core 32 to be controlled simply.

The no-wait signal NOWAITZ is inactivated when the column address CA generated by the address counter 28 indicates an end address at a second time. Accordingly, the memory core 32 can easily decide the inactivation timing of a pair of memory blocks M that are being activated. As a result, the operation of the memory core 32 can be controlled simply.

In the same manner, the no-wait signal NOWAITZ is inactivated in response to the turn-on operation of the column switch CSW corresponding to the second-time end address. Accordingly, the memory core 32 can accurately determine the inactivation timing of a pair of memory blocks M that are activated. It is thus possible to control the operation of the memory core 32 accurately.

The memory core 32 can easily decide on memory blocks M that input or output data according to the column selection circuit CLSEL generated by the control signal generator 22. This allows the operation of the memory core 32 to be controlled simply.

The logic level of the column selection signal CLSEL is inverted when the column address CA indicates the end address at the first time. Therefore, the memory core 32 can easily switch memory blocks M that input or output data. As a result, the operation of the memory core 32 can be conveniently controlled.

In the same manner, the logic level of the column selection signal CLSEL is inverted in response to the turn-on operation of the column switch CSW corresponding to the first-time end address. Accordingly, the memory core 32 can accurately decide the switch timing of the memory block M. As a result, the operation of the memory core 32 can be accurately controlled.

As the word lines WL corresponding to the start row address RA and the next row address +RA are simultaneously activated, the construction of the address selection circuit 34 can be simplified.

Figure 11:
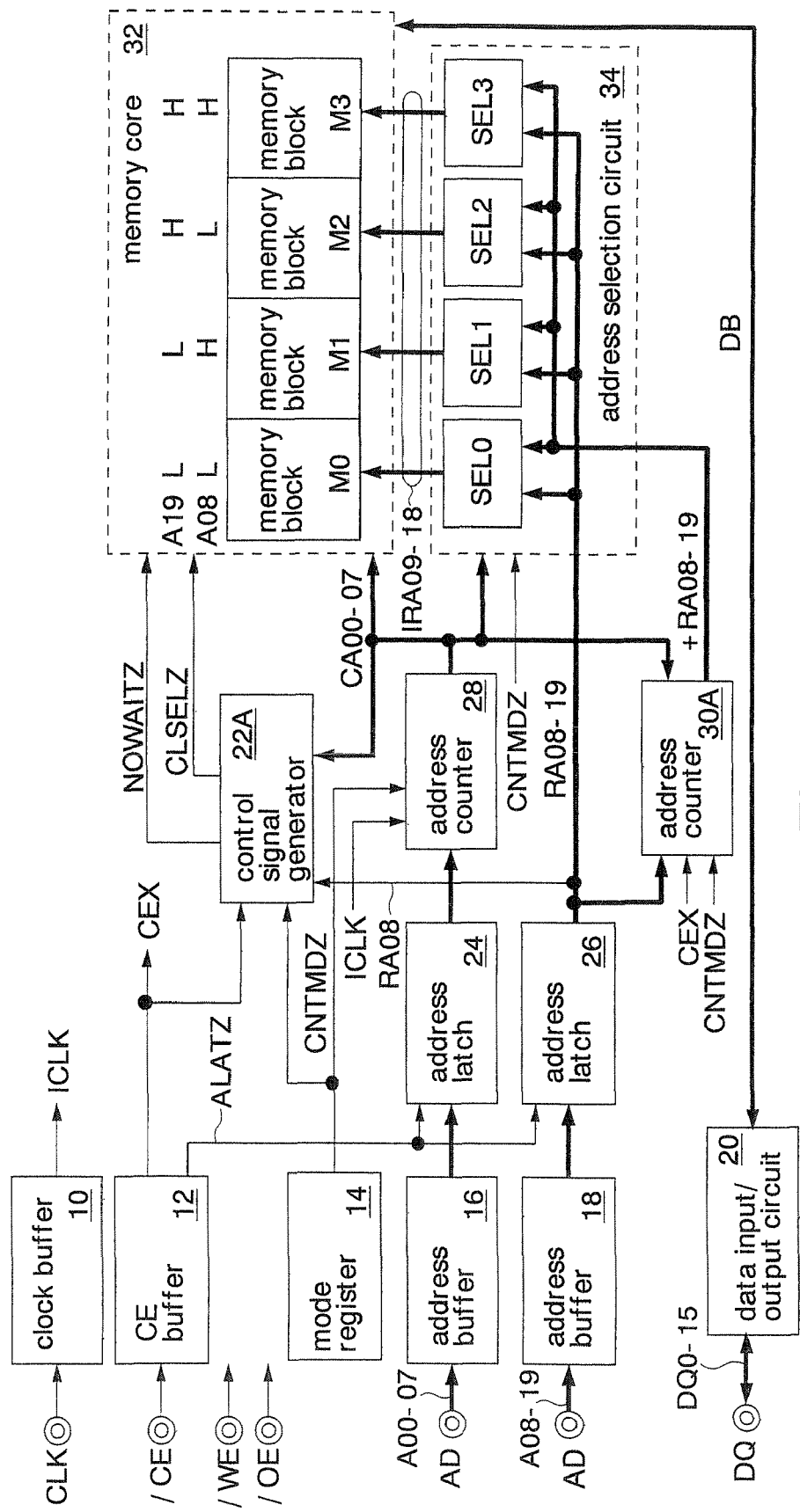
FIG. 11 is a block diagram of a semiconductor memory device according to a second embodiment of the present invention.

FIG. 11 shows the construction of a semiconductor memory device according to a second embodiment of the present invention. The same circuits and signals as those of the first embodiment will be assigned with the same reference numerals as those of the first embodiment, and detailed description thereof will be omitted.

The semiconductor memory device of the present embodiment is the same as that of the first embodiment except that a control signal generator 22A (first and second control signal generators) and an address counter 30A (a row address counter) are included instead of the control signal generator 22 and the address counter 30 of the first embodiment. In other words, the semiconductor memory device is formed as a FCRAM of the clock synchronous type which has the continuous mode. A memory core 32 outputs read data to each data terminal DQ on a 4-bit basis in synchronization with the clock signal CLK. The memory core 32 inputs write data to each data terminal DQ on a 4-bit basis in synchronization with the clock signal CLK.

The control signal generator 22A outputs the no-wait signal NOWAITZ (an overlap signal) and the column selection signal CLSELZ (a block selection signal) only when the column addresses CA00-07 indicate the end column selection signal CL, when it is first accessed in the continuous mode. That is, the no-wait signal NOWAITZ and the column selection signal CLSELZ are activated only when the start column addresses CA00-07 of the continuous access are FF, FD, FE and FF as hexadecimal number, i.e., when they correspond to the end column address.

In this case, as shown in FIG. 10, the memory block M corresponding to a start row address A (bits A08, A19) and a next address A+1 (bits A08, A19) thereof are simultaneously activated. Further, in a memory block M corresponding to the start row address A, the word lines WL corresponding to the start row address A (bits A09-18) are activated. At the same time, in the memory block M corresponding to the next row address A+1 thereof, the word lines WL corresponding to the next row address A+1 (bits A09-18) thereof are also activated.

The address counter 30A increases the start row address A (RA08-19) by "1" when the column addresses CA00-07 indicate the end column selection signal CL when it is first accessed in the continuous mode, and outputs the signal to the next row address A+1 (+RA08-19). The address counter 30A outputs the start row address (RA08-19) as the row address +RA08-19 when the column addresses CA00-07 do not indicate the end column selection signal CL when it is first accessed in the continuous mode. The address counter 30A then increases the row address +RA08-19 by "1" whenever the column selection signal CL corresponding to the end column addresses CA00-07 is activated. In other words, the number of row address +RA08-19 outputted by the address counter 30A is smaller by one than that of the first embodiment.

Figure 12:
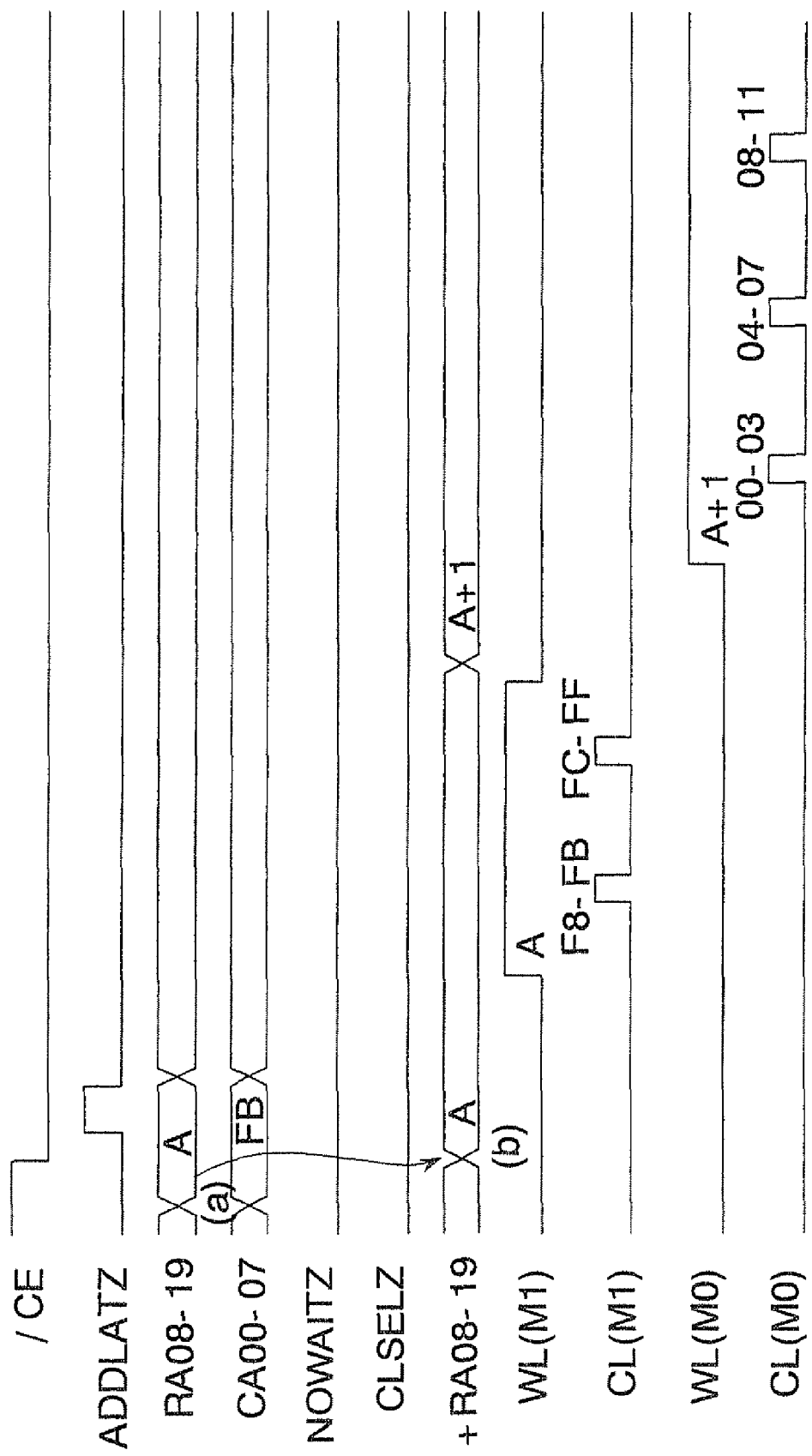
FIG. 12 is a timing diagram of an example of the operation in the continuous mode according to the second embodiment.

FIG. 12 shows an example of the operation in the continuous mode according to the second embodiment.

In this example, the column addresses CA00-07 (FB of hexadecimal number) that is supplied when it is first accessed in the continuous mode indicates a column selection signal CL in the second place from the end column selection signal (FIG. 12(a)). For this reason, the control signal generator 22 does not activate the no-wait signal NOWAITZ and the column selection signal CLSELZ.

The address counter 30A outputs the start row address RA 08-19(A) as the row address +RA08-19(A) since the start column addresses CA00-07(FB) do not correspond to the end column selection signal CL (FIG. 12(b)). For example, the start row addresses RA08-19(A) indicates the memory block M1.

The memory core 32 receives the no-wait signal NOWAITZ at a low level, activates only the memory block M1 to thereby activate only word lines WL in the memory block M1. Continuous access is then performed. Whenever the column selection signal CL corresponding to the end column address FF is activated, the memory block M and the word lines WL are switched. Continuous access is performed in the same manner as the first embodiment.

Furthermore, in the case where the column addresses CA00-07 supplied at the beginning of the continuous mode correspond to the end column selection signal CL (one of CA00-07="FC", "FD", "FE" and "FF"), the FCRAM operates in the same manner as FIG. 10. That is, the two word lines WL are simultaneously activated.

The present embodiment can also have the same effects as those described in the first embodiment. Moreover, in the present embodiment, in the case where the column addresses CA00-07 do not correspond to the end column selection signal CL when the continuous mode begins, the word lines WL are activated one by one. Since two memory blocks are prevented from simultaneously operating, it is possible to decrease power consumption during the operation.

Figure 13:
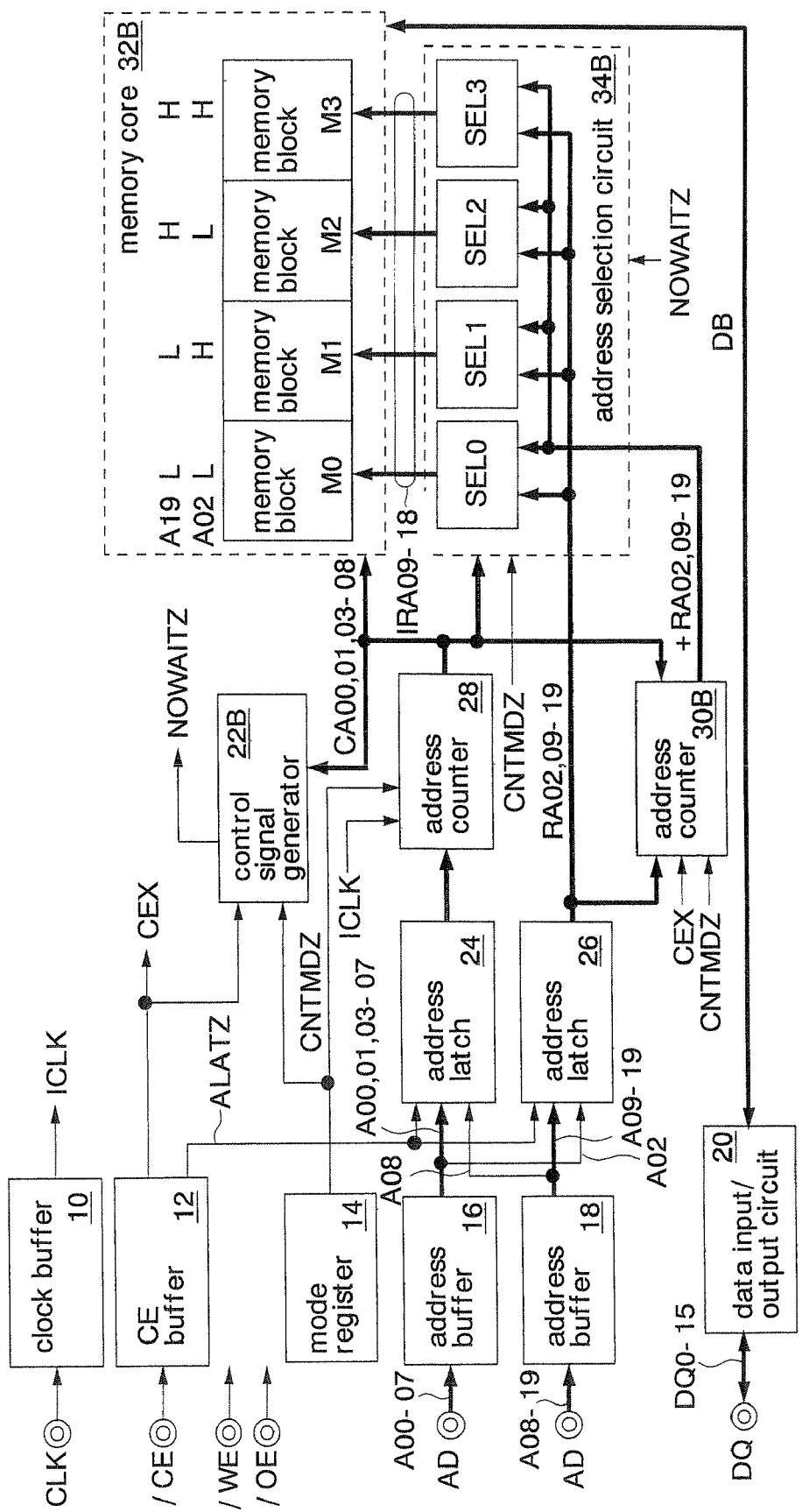
FIG. 13 is a block diagram of a semiconductor memory device according to a third embodiment of the present invention.

FIG. 13 shows the construction of a semiconductor memory device according to a third embodiment of the present invention. The same circuits and signals as those in the first embodiment will be assigned with the same reference numerals as those of the first embodiment, and detailed description thereof will not be given.

The construction according to the present embodiment is substantially same as that of the first embodiment except that a control signal generator 22B (a first control signal generator), an address counter 30B (a row address counter), a memory core 32B and an address selection circuit 34B (a word control circuit) are used instead of the control signal generator 22, the address counter 30, the memory core 32 and the address selection circuit 34 of the first embodiment. That is, the semiconductor memory device is formed as a FCRAM of the clock synchronous type which has the continuous mode.

The address latch circuit 24 receives column addresses A00, 01 and 03-07, and a row address A08, and outputs the received addresses A00, 01 and 03-08 as column address signals. The address latch circuit 26 receives a column address A02 and row addresses A09-19, and outputs the received addresses A02, 09-19 as row addresses RA02 and 09-19. In other words, in the present embodiment, the address A02 is used as the row address, and the address A08 is used as the column address.

The address counter 28 outputs the column addresses CA00, 01 and 03-08. The address counter 30A outputs row addresses +RA02 and 09-19 in which the row addresses PA02 and 09-19 are increased by "1".

The memory core 32B is composed of four memory blocks M0 to M3. The memory blocks M0 to M3 are selected according to the highest-order bit A19 and the lowest-order bit A02 of the row address RA. The memory core 32B keep activating two memory blocks M during the normal operation mode and the continuous mode, and activates the column selection signal CL twice in a consecutive manner. The main elements of the memory blocks M0 to M3 are the same as those of FIG. 6.

In the read operation, whenever the column selection signal CL is activated, data is outputted on a 2-bit basis from a memory block M that is activated. The read data is outputted to each of the data terminal DQ on a 4-bit basis in synchronization with the clock signal CLK, in the same manner as the first embodiment. In the write operation, data is inputted to a memory clock M that was activated on a 2-bit basis whenever the clock signal CLK is activated. The write data is inputted to each data terminal DQ on a 4-bit basis in synchronization with the clock signal CLK.

The address selection circuit 34B keeps activating two address selectors SEL corresponding to two memory blocks M that are activated, and outputs the row addresses IRA09-18 to the memory blocks M, respectively. The address selection circuit 34B outputs different row addresses IRA09-18 and +IRA09-18 to two memory blocks M that are accessed while the no-wait signal NOWAITZ is activated, and outputs the same row addresses IRA09-18 to the two memory blocks M while the no-wait signal NOWAITZ is inactivated.

The control signal generator 22B operates in the continuous mode, and outputs the no-wait signal NOWAITZ according to the chip enable signal CEX and the column addresses CA00-07. The control signal generator 22B does not output the column selection circuit CLSELZ. The no-wait signal NOWAITZ transits to a high level only when the column addresses CA00-07 indicate the end column selection signal CL, or a column selection signal CL in the second place from the end column selection signal CL when it is first accessed in the continuous mode.

Figure 14:
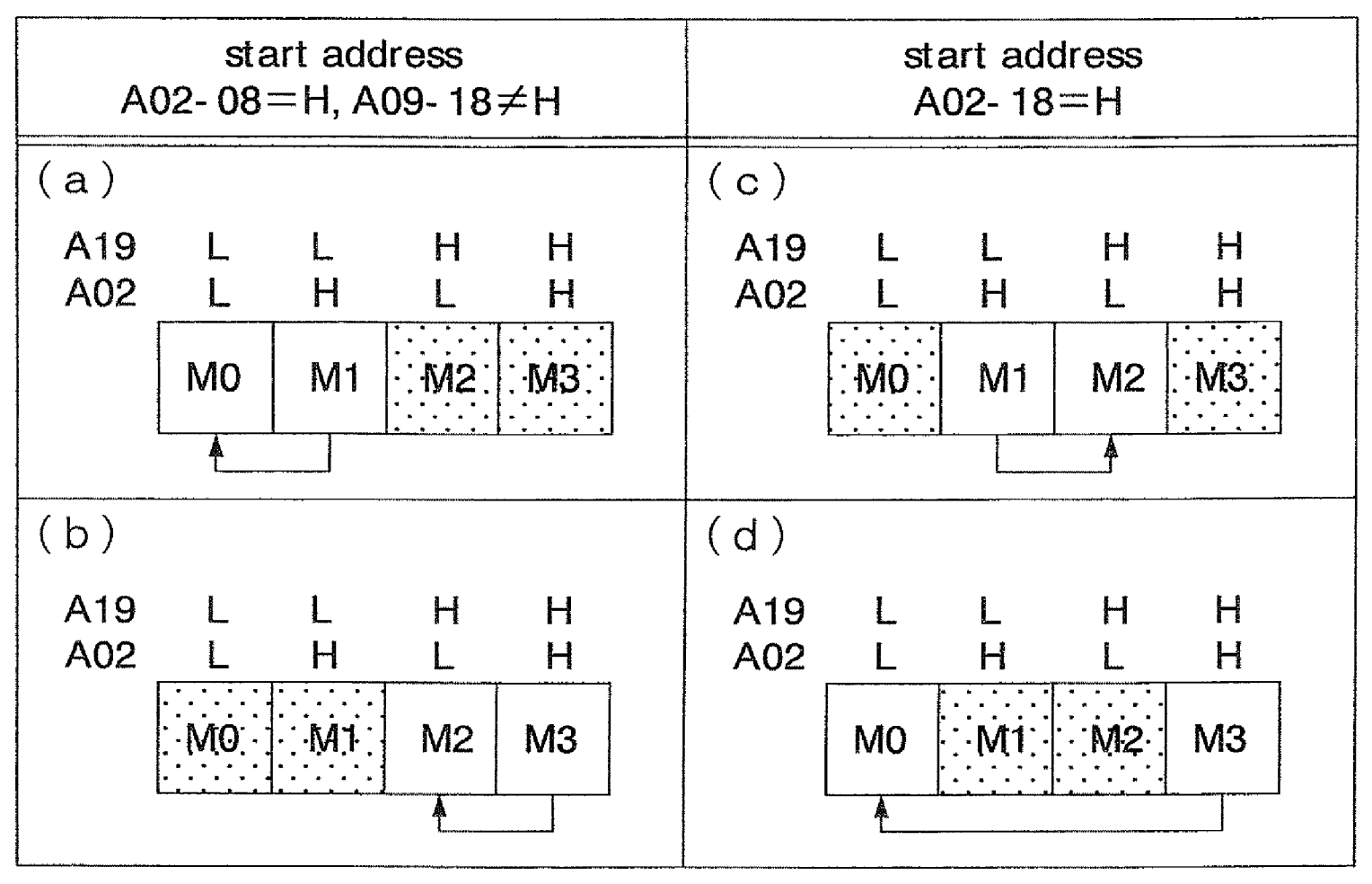

FIG. 14 shows the outline of the operation in the continuous mode according to the third embodiment.

When bits A02-08 (column addresses CA03-08 and a row address RA02) of the start address signal, which are supplied together with an access command at the beginning of the continuous mode, are all at "H", and one of the other bits A09-18 is at "L", a memory block M1 or M3 is first accessed, as shown in FIGS. 14(a) and 14(b). That is, a predetermined word line WL(A) within the memory block M1 or M3 is selected.

In the present embodiment, the memory blocks M0 to M3 are identified using the lowest-order bit A02 of the row address RA. As such, a word line WL(A+1) that has to be selected next exists in the memory block M0 or M2 on the left. Accordingly, when the access in the continuous mode begins, the word lines WL in the memory blocks M0 and M1 are simultaneously activated (FIG. 14(a)), or the word lines WL in the memory blocks M2 and M3 are simultaneously activated (FIG. 14(b)) by the address selection circuit 34B.

When the bits A02-18 (column addresses CA03-08, and row addresses RA02 and 09-18) of the start address signal are all at "H", the memory block M1 or M3 is first accessed, as shown in FIGS. 14(c) and 14(d). That is, a predetermined word line WL (A) within the memory block M1 or M3 is selected.

A word line WL(A+1) that must be selected subsequently exists in the memory block M2 or M0. When the access in the continuous mode begins, the word lines WL in the memory blocks M1 and M2 are simultaneously activated (FIG. 14(c)), or the word lines WL in the memory blocks M3 and M0 are simultaneously activated (FIG. 14(d)) by the address selection circuit 34B.

FIG. 15 shows the relationship between the start address supplied in the continuous mode and an activated memory block according to the third embodiment.

For example, when bits A02-08 of a start address AD is at "H" and a bit A19 is at "L", word lines WL of memory blocks M1 and M0 are simultaneously activated, and the read operation or the write operation is performed (corresponding to FIG. 14(a)). In the same manner, when the bits A02-08 and 19 of the start address AD is at "H", word lines WL in the memory blocks M3 and M2 are simultaneously activated, and the read operation or the write operation is performed (corresponding to FIG. 14(b)).

When the bits A02-18 of the start address AD is at "H" and the bit A19 is at "L", word lines WL in the memory blocks M1 and M2 are simultaneously activated, and the read operation or the write operation is performed (corresponding to FIG. 14(c)). When the bits A02-19 of the start address AD is at "H", word lines WL in the memory blocks M3 and M0 are simultaneously activated, and the read operation or the write operation is performed (corresponding to FIG. 14(d)).

Figure 16:
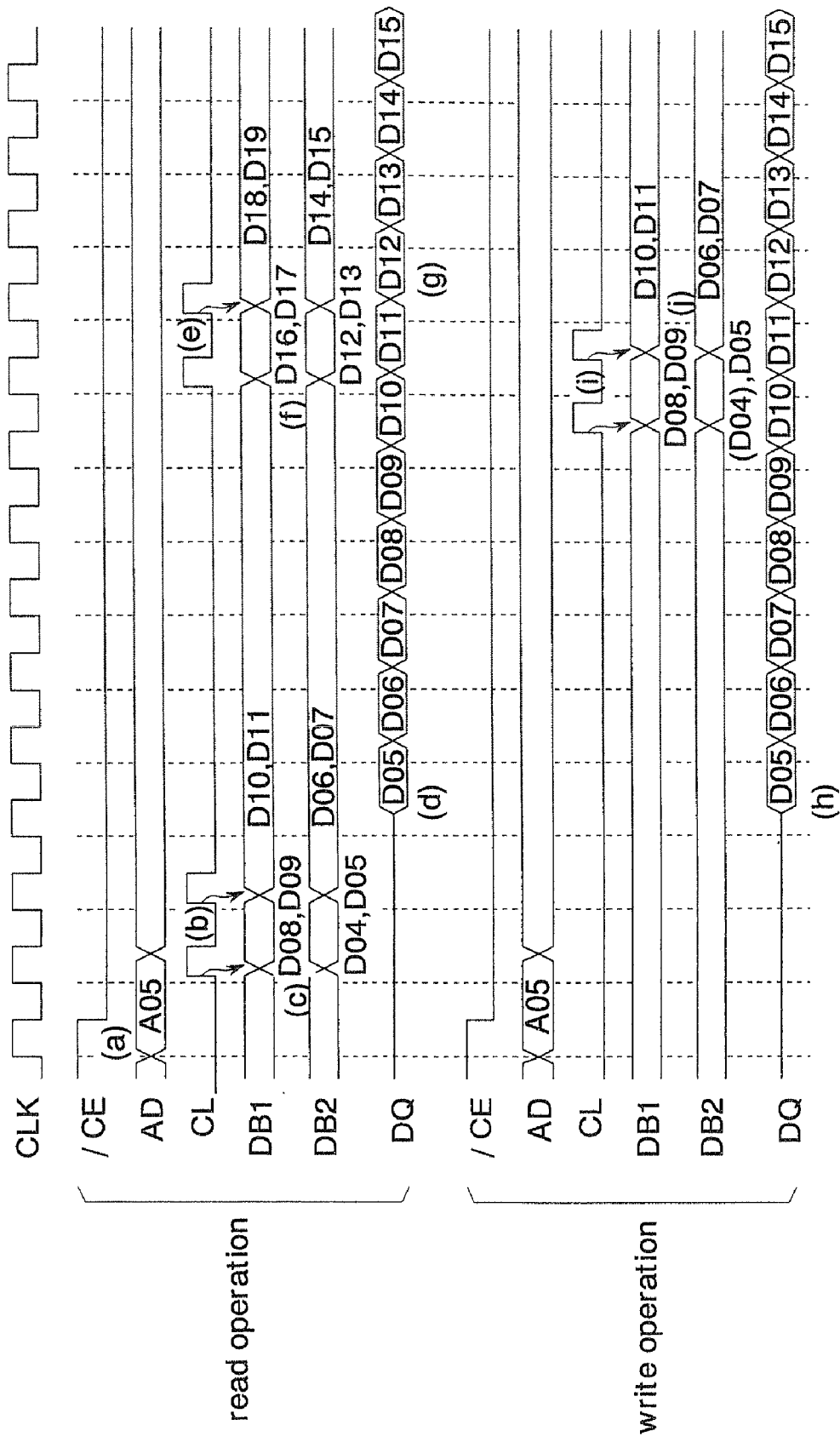
FIG. 16 is a timing diagram of an example of the read operation and the write operation of a FCRAM according to a third embodiment.

FIG. 16 shows an example of the read operation and the write operation of a FCRAM according to a third embodiment.

The FCRAM reads data from different memory blocks M on a 2-bit basis whenever the column selection signal CL is activated (4-bit parallel data), and latches the data in a data latch through a data bus line DB, with respect to a 1-bit data terminal DQ, during the read operation. The data latch converts the received parallel data into serial data, and sequentially outputs them to the data terminal DQ in synchronization with a clock.

In the continuous read operation, the chip enable signal /CE is activated, and the start address AD (A05, in this example) is supplied to the FCRAM (FIG. 16(a)). The FCRAM activates the column selection signal CL twice in a consecutive manner (FIG. 16(b)). Data is thus outputted to data bus lines DB1 and DB2 on a 2-bit basis whenever the column selection signal CL is activated (FIG. 16(c)). Furthermore, eight read data D04-11 including data D05 corresponding to the address A05 are latched in the data latch. That is, data for eight addresses are latched in the data latch per every data terminal DQ. The latched parallel read data is converted into serial data, and are outputted in a sequential manner in synchronization with the clock signal CLK (FIG. 16(d)).

The FCRAM then activates the column selection signal CL twice every 8 clocks (FIG. 16(e)), and reads data from two memory blocks M twice on a 2-bit basis (FIG. 16(f)). The read parallel data is latched in the data latch, converted into serial data, and then output in synchronization with the clock signal CLK in a sequential manner (FIG. 16(g)).

Meanwhile, in the continuous write operation, after a predetermined clock elapses from the supply of the start address A05, write data D05, 06, 07, an so on are sequentially supplied to the data terminals DQ in synchronization with a clock signal CLK (FIG. 16(h)). The serial write data is converted into parallel data, and then latched in the data latch. After a predetermined number of write data is latched in the data latch, the column selection signal CL is consecutively activated twice (FIG. 16(i)). The write data is written into the memory cells MC on a 4-bit basis (FIG. 16(j)). At this time, negative write data D04 exist in the data bus line DB2. However, the data D04 are not written into the memory cells due to the inactivation of the column selection signal CL corresponding to the data D04 or the inactivation of the write amplifier corresponding to the data D04.

Figure 17:
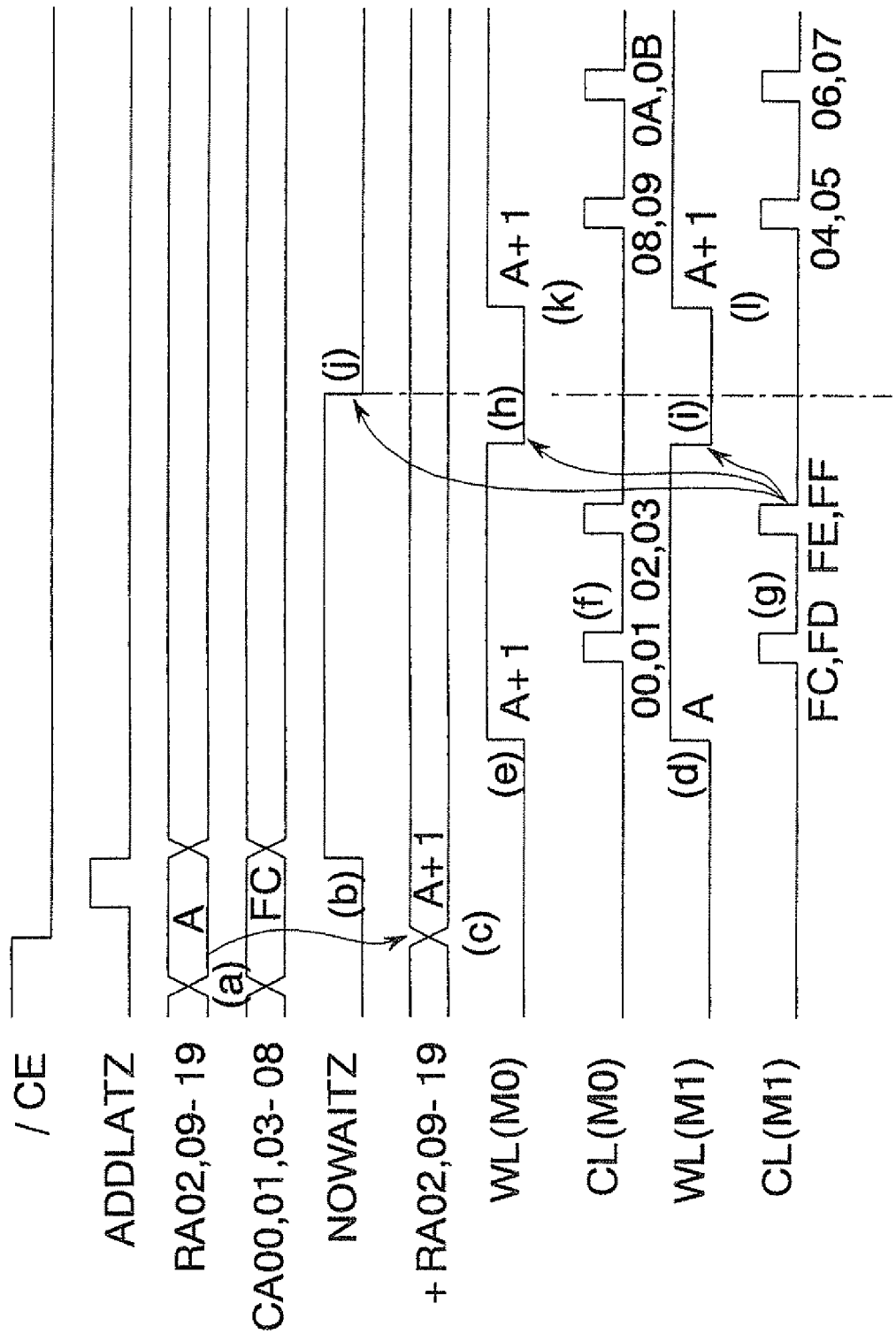
FIG. 17 is a timing diagram of an example of the operation in the continuous mode according to the third embodiment.

FIG. 17 shows an example of the operation in the continuous mode according to the third embodiment.

In this example, the mode resistor 14 shown in FIG. 13 has information, which indicates the continuous mode, set in advance therein. A FCRAM starts the continuous read operation or the continuous write operation when it detects that the chip enable signal /CE shifts to a low level in synchronization with a clock signal CLK (not shown).

For example, the FCRAM receives row addresses PA02 and 09-19="A" and column addresses CA00, 01 and 03-08="FC" (hexadecimal number), which indicate a memory block M1, together with the chip enable signal /CE when it is first accessed in the continuous mode (FIG. 17(a)). Since the start column address is "FC", column addresses corresponding to the column selection signals CL that are activated twice consecutively are "FC", "FD", "FE" and "FF". That is, the start column address FC includes the end column address FF. Due to this, the control signal generator 22B activates the no-wait signal NOWAITZ to a high level in synchronization with a falling edge of the chip enable signal /CE (FIG. 17(b)).

The address counter 30B outputs a row address "A+1 (+RA02, 09-19)" in which the row address "A" is increased by "1" since the start column address FC indicates the end column selection signal CL that is activated twice in a consecutive manner (FIG. 17(c)). The row address "A" is an address for indicating, e.g., the memory block M1. The address selection circuit 34B receives activation of the no-wait signal NOWAITZ, and selects two address selectors SEL1 and SEL0 according to the row address "A". Furthermore, the address selection circuit 34B receives activation of the no-wait signal NOWAITZ, outputs the row address "A" from the address selector SEL1, and outputs the row address "A+1" from the address selector SEL0.

The memory core 32B operates in response to a control signal, such as the basic timing signal RASZ outputted from an operating control circuit. The memory core 32B activates memory blocks M1 and M0 respectively corresponding to the selected address selectors SEL0 and SEL1. The memory block M1 activates word lines WL corresponding to the row address "A" (FIG. 17(d)). The memory block M0 activates the word lines WL corresponding to the row address "A+1" (FIG. 17(e)). The memory blocks M0 and M1 simultaneously activate the word lines WL, and simultaneously activate the sense amplifiers SA. For example, when continuous access is read access, data is read out to the bit line BLZ or BLX from the memory cells MC due to activation of the word lines WL, and the amount of signal thereof is amplified by the sense amplifiers SA.

The memory core 32B then activates the column selection signal CL of the memory blocks M0 and M1 (FIGS. 17(f) and 17(g)). As shown in FIG. 16, a single activation of the column selection signal CL allows data to be read from the memory blocks M0 and M1 on a 2-bit basis (a read operation), or a single activation of the column selection signal CL allows data to be written into the memory blocks M0 and M1 on a 2-bit basis (a write operation).

The memory blocks M0 and M1 inactivate the word lines WL in response to the activation (the turn-on operation of the column switch CSW) of the column selection signal CL corresponding to the end column address FF (FIGS. 17(h) and 17(i)). The control signal generator 22B inactivates the no-wait signal NOWAITZ in response to the access (activation of the column selection signal CL) of the memory cells MC corresponding to the end column address FF (FIG. 17(j)).

The address selection circuit 34B receives inactivation of the no-wait signal NOWAITZ, and then outputs the same row address A+1 to two memory blocks M0 and M1 that attempt to access thereto. Thereafter, in the same manner as the normal operation mode, the two memory blocks M0 and M1 activate the word lines WL corresponding to the same row address A+1 (FIGS. 17(k) and 17(l)). Data is also read from the memory blocks M0 and M1 on a 2-bit basis in synchronization with the column selection signal CL, or data is written into the memory blocks M0 and M1 on a 2-bit basis in synchronization with the column selection signal CL. That is, continuous access is performed without interrupting data.

Figure 18:
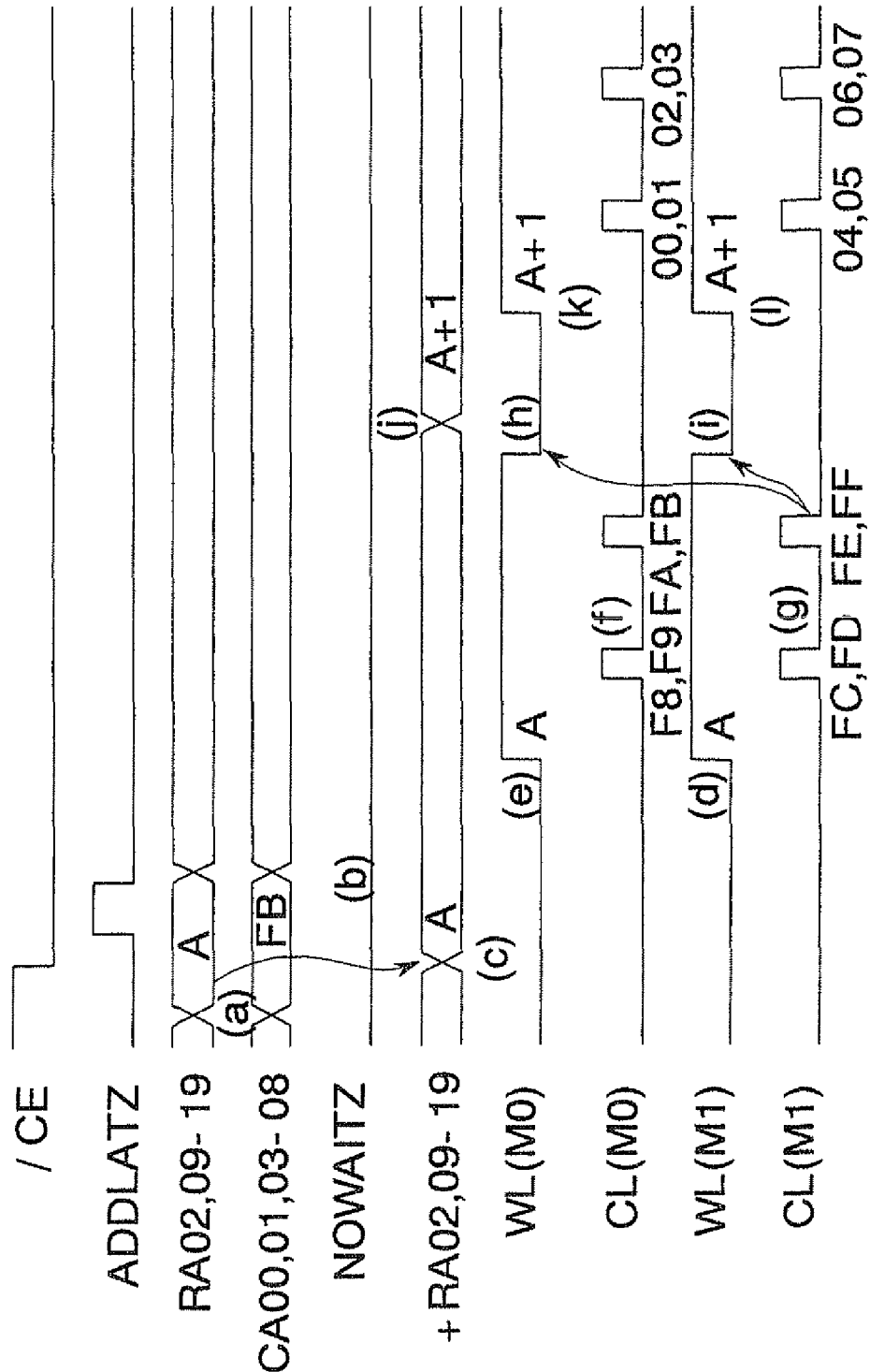
FIG. 18 is a timing diagram of another example of the operation in the continuous mode according to the third embodiment.

FIG. 18 shows another example of the operation in the continuous mode according to the third embodiment. Detailed description will not be given on the same operation as that of FIG. 17 for simplicity.

In this example, the FCRAM receives row addresses RA02, 09-19="A" and column addresses CA00, 01 and 03-08="FB" (hexadecimal number), which indicate a memory block M1, together with the chip enable signal /CE when it is first accessed in the continuous mode (FIG. 18(a)). The start column address FB does not correspond to the end column selection signal CL that is activated twice in a consecutive manner. Therefore, the control signal generator 22B does not activate the no-wait signal NOWAITZ (FIG. 18(b)).

The address counter 30B outputs start row addresses RA02 and 09-19(A) as row addresses +RA02, 09-19(A) since the start column addresses CA00, 01 and 03-08 (FB) do not correspond to the end column selection signal CL that is activated twice in a consecutive manner (FIG. 18(c)). The row address "A" is an address, which indicates, for example, the memory block M1. The address selection circuit 34B selects two address selectors SEL1 and SEL0 according to the row address "A" in the same manner as the normal operation mode. The address selection circuit 34B also outputs the row address "A" from the address selectors SEL1 and SEL0.

The memory core 32B activates the memory blocks M1 and M0 each corresponding to the selected address selectors SEL0 and SEL1. The memory blocks M1 and M0 simultaneously activate word lines WL corresponding to the row address "A" (FIGS. 18(d) and 18(e)). The column selection signal CL of the memory blocks M0 and M1 is then activated, and the read data is read in a sequential manner (FIGS. 18(f) and 18(g)), or write data is sequentially written into the memory blocks M0 and M1.

The word lines WL in the memory blocks M0 and M1 are inactivated in response to the activation of the column selection signal CL corresponding to the end column address FF (FIGS. 18(h) and 18(i)). The address counter 30B increases the row addresses +RA02 and 09-19 (=A) by "1", and changes them to "A+1", in response to the activation of the column selection signal CL corresponding to the end column address FF (FIG. 18(j)). Thereafter, in the same manner as the normal operation mode, the two memory blocks M0 and M1 activate the word lines WL corresponding to the same row address A+1 (FIGS. 18(k) and 18(l)). Further, data is read from the memory blocks M0 and M1 on a 2-bit basis in synchronization with the column selection signal CL, or data is written into the memory blocks M0 and M1 on a 2-bit basis in synchronization with the column selection signal CL. That is, continuous access is performed without interrupting data.

The present embodiment can also have the same effects as those of the first and second embodiments. Further, in the present embodiment, even in an FCRAM in which two memory blocks M are simultaneously activated during the normal operation mode, continuous access can be performed without interrupting read data or write data.

In more detail, when the column address CA corresponds to the end address, word lines WL of a pair of memory blocks M are activated according to a start row address RA and a next row address +RA. It is thus possible to input or output data without interrupting the data. A subsequent operation can be performed through activation of the word lines WL of the pair of the memory blocks M according to the same row address +RA, in the same manner as the normal operation mode. This makes simple the structure of the address selection circuit 34B.

In the above-described embodiments, examples in which the present invention is applied to a FCRAM have been described, but the present invention is not limited to these embodiments. For example, the present invention can be applied to a SDRAM or the clock synchronous type of a flash memory.

Further, in the aforementioned embodiments, examples in which the present invention is applied to a FCRAM of the SDR mode have been described, but the present invention is not limited to these embodiments. For example, the present invention can be applied to a FCRAM, SDRAM or flash memory of the DDR (Double Data Rate) mode in which data is inputted or outputted in synchronization with both a rising edge and a falling edge of the clock signal CLK.

The invention is not limited to the above embodiments and various modifications may be made without departing from the spirit and scope of the invention. Any improvement may be made in part or all of the components.

What is claimed is:

1. A semiconductor device comprising:
a memory core having a plurality of memory cells connected to word lines, respectively;
a row address terminal that receives a row address for selecting the word lines; and
a word control circuit that simultaneously activates different word lines corresponding to the row address and an internal row address which is generated in a counter, when reading data successively from the memory cells or writing data successively into the memory cells.

2. The semiconductor device according to claim 1, further comprising a row address counter that generates the internal row address following the row address.

3. The semiconductor device according to claim 1, wherein the word control circuit activates two of the word lines at a beginning of reading data from the respective memory cells or writing data into the memory cells to the respective memory cells, and then activates the word lines one by one.

4. The semiconductor device according to claim 1, wherein the memory core includes a plurality of memory blocks, the word control circuit includes a plurality of address selectors corresponding to the memory blocks, the memory blocks are activated according to one of the row address and the internal row address outputted from the address selector.

5. The semiconductor device according to claim 4, wherein a lowest-order bit of the row address is used to select any one of the memory blocks.

6. The semiconductor device according to claim 1, further comprising;
a first control signal generator that activates an overlap signal at a beginning of reading data the from memory cells or writing data into the memory cells, to activate a pair of memory blocks simultaneously corresponding to the row address and the internal row address.

7. The semiconductor device according to claim 1, further comprising:
a column address terminal that receives a column address for selecting the memory cells,
wherein the word control circuit activates two of the word lines simultaneously when the start column address supplied to the column address terminal is an end column address, and sequentially activates the word lines one by one when the start column address is not the column end address.

8. The semiconductor device according to claim 7 further comprising:
a first control signal generator that activates an overlap signal when the start column address is the end column address,
wherein the memory core includes a plurality of memory blocks corresponding to the row address, and activates a pair of memory blocks simultaneously according to the row address and the internal row address when receiving the overlap signal.

9. The semiconductor device according to claim 1, further comprising;
a clock terminal that receives a clock; and
data terminals that output read data from the memory cells and input write data to the memory cells, wherein the read data is sequentially outputted to the data terminals in synchronization with the clock, and the write data is sequentially inputted to the data terminals in synchronization with the clock.

10. A semiconductor device comprising:
a memory core having a plurality of memory cells connected to word lines, respectively;
a row address terminal that receives a row address for selecting the word lines; and
a word control circuit that sequentially activates different word lines corresponding to the row address and an internal row address, when reading data successively from the memory cells or writing data successively into the memory cells.

11. A system comprising:
a controller accessing a semiconductor device;
a memory core having a plurality of memory cells connected to word lines, respectively;
a row address terminal that receives a row address for selecting the word lines; and
a word control circuit that simultaneously activates different word lines corresponding to the row address and an internal row address which is generated in a counter, when reading data successively from the memory cells or writing data successively into the memory cells.

12. The system according to claim 11, further comprising a row address counter that generates the internal row address following the row address.

13. The system according to claim 11, wherein the word control circuit activates two of the word lines at a beginning of reading data from the respective memory cells or writing data into the memory cells to the respective memory cells, and then activates the word lines one by one.

14. The system according to claim 11, wherein the memory core includes a plurality of memory blocks, the word control circuit includes a plurality of address selectors corresponding to the memory blocks, the memory blocks are activated according to one of the row address and the internal row address outputted from the address selector.

15. The system according to claim 14, wherein a lowest-order bit of the row address is used to select any one of the memory blocks.

16. The system according to claim 11, further comprising;
a first control signal generator that activates an overlap signal at a beginning of reading data the from memory cells or writing data into the memory cells, to activate a pair of memory blocks simultaneously corresponding to the row address and the internal row address.

17. The system according to claim 11, further comprising:
a column address terminal that receives a column address for selecting the memory cells, wherein the word control circuit activates two of the word lines simultaneously when the start column address supplied to the column address terminal is an end column address, and sequentially activates the word lines one by one when the start column address is not the column end address.

18. The system according to claim 17 further comprising:

a first control signal generator that activates an overlap signal when the start column address is the end column address, wherein the memory core includes a plurality of memory blocks corresponding to the row address, and activates a pair of memory blocks simultaneously according to the row address and the internal row address when receiving the overlap signal.

19. The system according to claim 11, further comprising;

a clock terminal that receives a clock; and data terminals that output read data from the memory cells and input write data to the memory cells, wherein the read data is sequentially outputted to the data terminals in synchronization with the clock, and the write data is sequentially inputted to the data terminals in synchronization with the clock.

20. A system comprising:

a controller accessing a semiconductor device;

a memory core having a plurality of memory cells connected to word lines, respectively;

a row address terminal that receives a row address for selecting the word lines; and a word control circuit that sequentially activates different word lines corresponding to the row address and an internal row address, when reading data successively from the memory cells or writing data successively into the memory cells.

\* \* \* \* \*